US008179730B2

United States Patent
Shimizu et al.

(10) Patent No.: US 8,179,730 B2
(45) Date of Patent: May 15, 2012

(54) SEMICONDUCTOR DEVICE AND SEMICONDUCTOR MEMORY TESTER

(75) Inventors: Yuui Shimizu, Minato-ku (JP); Shigeo Ohshima, Minato-ku (JP); Mie Matsuo, Minato-ku (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/963,247

(22) Filed: Dec. 8, 2010

(65) Prior Publication Data
US 2011/0074494 A1    Mar. 31, 2011

Related U.S. Application Data

(63) Continuation of application No. 12/142,278, filed on Jun. 19, 2008, now Pat. No. 7,869,240.

(30) Foreign Application Priority Data

Jun. 19, 2007  (JP) ................................. 2007-161558

(51) Int. Cl.
*G11C 5/14* (2006.01)
*G11C 5/02* (2006.01)
*G11C 5/06* (2006.01)
*H01L 23/02* (2006.01)
*H01L 23/12* (2006.01)
*H01L 23/52* (2006.01)

(52) U.S. Cl. ....... 365/189.09; 365/51; 365/63; 365/226; 257/686; 257/723; 257/777

(58) Field of Classification Search .............. 365/189.09
See application file for complete search history.

(56) References Cited

U.S. PATENT DOCUMENTS

| 5,267,218 | A | * | 11/1993 | Elbert ....................... 365/185.04 |
| 5,394,372 | A | * | 2/1995  | Tanaka et al. ................. 365/226 |
| 5,561,622 | A |   | 10/1996 | Bertin et al. |
| 5,659,519 | A | * | 8/1997  | Lee et al. ................. 365/230.06 |
| 5,677,874 | A | * | 10/1997 | Yamano ................... 365/185.18 |
| 5,693,570 | A |   | 12/1997 | Cernea et al. |
| 5,774,399 | A | * | 6/1998  | Kwon ....................... 365/185.18 |
| 5,781,494 | A | * | 7/1998  | Bae et al. ................. 365/230.03 |
| 5,982,222 | A | * | 11/1999 | Kyung .......................... 327/536 |
| 6,172,931 | B1 | * | 1/2001 | Cha et al. ....................... 365/226 |
| 6,434,044 | B1 |   | 8/2002 | Gongwer et al. |

(Continued)

FOREIGN PATENT DOCUMENTS
JP    4-132087    5/1992
(Continued)

OTHER PUBLICATIONS

Office Action (with English translation) issued on Jan. 24, 2012, in counterpart Japanese Appln. No. 2007-161558 (10 pages).

*Primary Examiner* — Son Mai
(74) *Attorney, Agent, or Firm* — Oblon, Spivak, McClelland, Maier & Neustadt, L.L.P.

(57) ABSTRACT

A semiconductor device, a semiconductor memory tester, and a multi-chip package are provided. The semiconductor device includes a plurality of nonvolatile semiconductor memories; a boosting circuit which generates a boosted voltage for operating the plurality of nonvolatile semiconductor memories; and a boosting circuit controller which controls the operation of the boosting circuit to generate the boosted voltage on the basis of an operation sequence of the plurality of nonvolatile semiconductor memories.

10 Claims, 20 Drawing Sheets

U.S. PATENT DOCUMENTS

| | | | |
|---|---|---|---|
| 6,469,573 B2 * | 10/2002 | Kanda et al. | 327/541 |
| 6,577,535 B2 * | 6/2003 | Pasternak | 365/185.11 |
| 6,624,506 B2 * | 9/2003 | Sasaki et al. | 257/686 |
| 6,643,162 B2 * | 11/2003 | Takeuchi et al. | 365/145 |
| 6,704,237 B2 * | 3/2004 | Park | 365/226 |
| 6,765,428 B2 * | 7/2004 | Kim et al. | 327/534 |
| 6,791,175 B2 | 9/2004 | Matsuo et al. | |
| 6,991,964 B2 | 1/2006 | Matsuo et al. | |
| 7,046,571 B2 * | 5/2006 | Kim et al. | 365/226 |
| 7,099,173 B2 | 8/2006 | Koide | |
| 7,251,705 B2 * | 7/2007 | Pasotti et al. | 711/103 |
| 7,268,611 B2 * | 9/2007 | Kikuchi et al. | 327/536 |
| 7,332,955 B2 * | 2/2008 | Shin | 327/534 |
| 7,352,067 B2 | 4/2008 | Fukaishi et al. | |
| 7,403,441 B2 * | 7/2008 | Castaldo et al. | 365/226 |
| 7,531,905 B2 | 5/2009 | Ishino et al. | |
| 7,580,296 B2 * | 8/2009 | Thorp et al. | 365/189.06 |
| 7,613,051 B2 * | 11/2009 | Cornwell | 365/189.09 |
| 7,619,945 B2 * | 11/2009 | Norman | 365/226 |
| 7,623,393 B2 * | 11/2009 | Kang | 365/189.09 |
| 7,663,958 B2 * | 2/2010 | Choi | 365/226 |
| 2003/0095439 A1 * | 5/2003 | San et al. | 365/185.22 |
| 2008/0074930 A1 | 3/2008 | Kanda | |
| 2009/0135638 A1 | 5/2009 | Shimizu | |
| 2011/0164450 A1 * | 7/2011 | Norman | 365/185.09 |

FOREIGN PATENT DOCUMENTS

| | | |
|---|---|---|
| JP | 9-294367 | 11/1997 |
| JP | 2675052 | 11/1997 |
| JP | 11-283398 | 10/1999 |
| JP | 2977576 | 11/1999 |
| JP | 2000-75940 | 3/2000 |
| JP | 2001-230391 | 8/2001 |
| JP | 2001-266572 | 9/2001 |
| JP | 2001-319483 | 11/2001 |
| JP | 2002-133883 | 5/2002 |
| JP | 3554135 | 8/2004 |
| JP | 2004-531801 | 10/2004 |
| JP | 2004-348806 | 12/2004 |
| JP | 3755764 | 3/2006 |
| JP | 2006-286048 | 10/2006 |
| JP | 2007-122766 | 5/2007 |
| WO | WO 2007/013132 | 2/2007 |

* cited by examiner

SEMICONDUCTOR DEVICE AND SEMICONDUCTOR MEMORY TESTER

CROSS-REFERENCE TO RELATED APPLICATIONS

This application is a continuation of and claims the benefit of priority under 35 U.S.C. §120 from U.S. Ser. No. 12/142,278 filed Jun. 19, 2008, and claims the benefit of priority under 35 U.S.C. §119 from Japanese Patent Application No. 2007-161558 filed Jun. 19, 2007, the entire contents of each of which are incorporated herein by reference.

BACKGROUND OF THE INVENTION

1. Technical Field

Devices and apparatuses consistent with the present invention relate to semiconductor devices and, more particularly, to semiconductor devices having a voltage generating circuit for generating an operation voltage of a nonvolatile semiconductor memory, and to semiconductor memory testers for testing an operation of a nonvolatile semiconductor memory.

2. Description of the Related Art

In related art semiconductor devices, and particularly in related art nonvolatile semiconductor memories, it is desirable to increase the capacity of the memory. It is also desirable to reduce the size in order to provide a device at a competitive price. Accordingly, the size of a memory cell has been reduced, circuits (such as a controller, a read only memory (ROM), and a random access memory (RAM)) of a memory system have been simplified, and an exclusive area for a memory cell has been increased. For example, programming, reading, and erasing operations of a flash memory use multiple exclusive controlled boosted voltages. These boosted voltages are generated by a pump circuit (i.e., a boosting circuit) and are supplied from the pump circuit to the flash memory at a time when the flash memory is operating.

The pump circuit includes, for example, a plurality of diodes and capacitors, and an area in a chip used by the pump circuit is greater than an area in a chip used by other circuits. On the other hand, to cope with devices such as a mobile device and the like in which an area for a memory chip on a mounting substrate is restricted, a multi-chip package (hereinafter, referred to as "MCP") in which a plurality of memory chips are overlapped and enclosed in a package has been developed and widely used. A controller chip which controls memories is built in the MCP chip. Each of the memory chips enclosed in the MCP chip has a pump circuit. The pump circuit has a function of supplying a boosted voltage to the plurality of memory chips from a circuit. In terms of circuit configuration, it is redundant that each of the memory chips in the MCP chip has its own pump circuit. Alternatively, it has been proposed that the plurality of memory chips share one pump circuit, and that the pump circuit is provided, for example, in a controller chip. Thus, the occupying area of parts of the memory chips other than the pump circuits in a mounting substrate can be enlarged, thereby contributing to an increase in memory capacity.

On the other hand, providing the pump circuit in a controller chip presents some disadvantages. For example, in the MCP chip in which a plurality of memory chips having the same specification are enclosed in a package to embody a large-capacity package, the plurality of memory chips can share a voltage source used, for example, for a reading operation. If the pump circuit that supplies the voltage for the reading operation is removed from each of the memory chips, and is instead provided in a separate chip that is enclosed as a pump chip in the MCP chip, it is difficult to perform a pre-shipping test for the memory chips using known test systems. Accordingly, by mounting the pump chip on a test jig and actuating the pump chip at the time of testing the MCP chip, the pre-shipping test is enabled.

In a related art semiconductor circuit device described in JP-A-11-283398, a boosting circuit is connected to a power terminal of a flash electrically erasable and programmable read only memory (EEPROM) which operates with a single power source. A power source monitoring terminal for monitoring a power source selected by a power source selecting switch is provided, whereby it is possible to monitor a boosting power source at a time of testing the flash EEPROM. It is possible to determine whether a variation in operation characteristic of the flash EEPROM is due to a variation in boosting power source or due to a variation in flash EEPROM, thereby facilitating the test of the flash EEPROM body.

SUMMARY OF THE INVENTION

An aspect of the present invention is to provide a semiconductor apparatus capable of outputting failure analysis test data while testing a memory at a specified frequency through a built in self-test (BIST), and a testing method therefore.

According to an aspect of the present invention, there is provided a semiconductor apparatus which comprises a plurality of nonvolatile semiconductor memories; a boosting circuit which generates a boosted voltage for operating the plurality of nonvolatile semiconductor memories; and a boosting circuit controller which controls the operation of the boosting circuit to generate the boosted voltage on the basis of an operation sequence of the plurality of nonvolatile semiconductor memories.

BRIEF DESCRIPTION OF THE DRAWINGS

FIG. 9(a) shows a waveform of a reference clock signal Clock, FIG. 9(b) shows a waveform of a Read command/control signal, FIG. 9(c) shows a waveform of a Ready/Busy signal 1, FIG. 9(d) shows a waveform of a pump start signal EN1, FIG. 9(e) shows a waveform of a Ready/Busy signal 2, FIG. 9(f) shows a waveform of a pump start signal EN2, FIG. 9(g)

shows a waveform of a Ready/Busy signal 3, FIG. 9(h) shows a waveform of a pump start signal EN3, FIG. 9(i) shows a waveform of a Ready/Busy signal 4, FIG. 9(j) shows a waveform of a pump start signal EN4, and FIG. 9(k) shows a waveform of a waveform of a boosting signal Vpmp;

DETAILED DESCRIPTION OF EXEMPLARY EMBODIMENTS OF THE INVENTION

Figure 1:
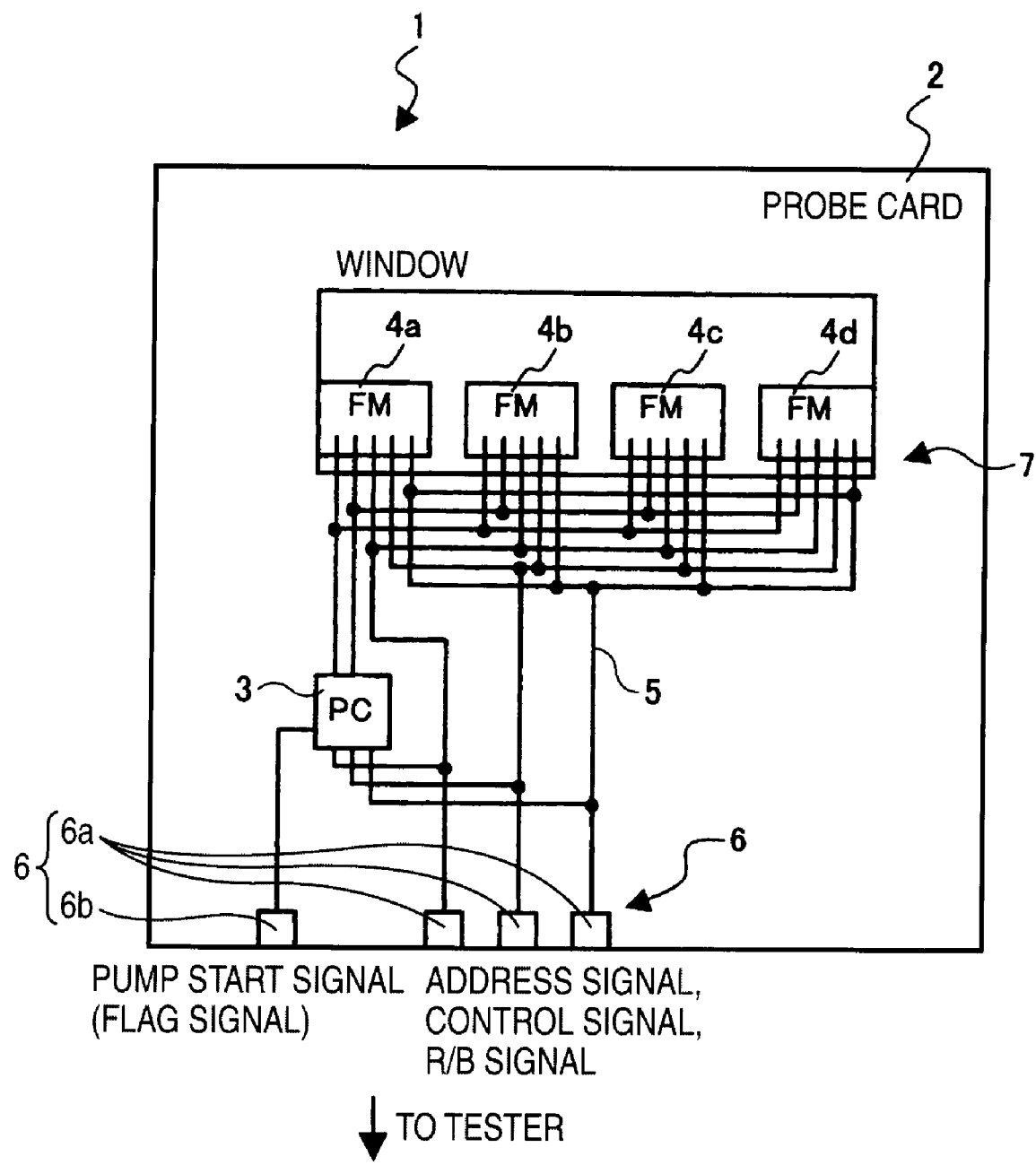
FIG. 1 is a diagram illustrating a configuration of a test system for a flash memory employing a pump chip according to a first exemplary embodiment of the invention.

Hereinafter, exemplary embodiments of the invention will be described with reference to the accompanying drawings. In the following description, a semiconductor device according to exemplary embodiments of the present invention is discussed in relation to a flash memory. However, one of ordinary skill in the art will recognize that the present inventive concept applies equally to other semiconductor devices. In the description of exemplary embodiments, like elements are denoted by like reference numerals and overlapping description of the exemplary embodiments is omitted.

First Exemplary Embodiment

FIG. 1 is a diagram illustrating a configuration of a test system 1 for a flash memory employing a pump chip according to a first exemplary embodiment of the invention. Flash memories (FM) 4a to 4d are memories to be tested in the test system 1. In the flash memories 4a to 4d, a pump circuit is removed from the memory chip body, and the removed pump circuit is mounted as a pump chip (PC) 3 on a probe card 2. An address signal and a control signal supplied to the probe card 2 from an external tester (not shown) are supplied to the flash memories (FM) 4a to 4d and to the pump chip (PC) through wires 5 formed on the probe card 2. A boosting signal Vpmp which is generated in the pump chip (PC) 3 is supplied to the flash memories (FM) 4a to 4d through the wires 5 on the probe card 2.

The probe card 2 is provided with a plurality of pads 6 for inputting signals, such as the address signal, the control signal, and the like, supplied from the tester. The plurality of pads 6 comprise a plurality of pads 6a that are coupled to the flash memories (FM) 4a to 4d, and a pad 6b that is coupled to the pump chip (PC) 3. The pads 6a that are coupled to the flash memories (FM) 4a to 4d receive the address signal, the control signal, and the like supplied from the tester, and output a Ready/busy signal output from the flash memories (FM) 4a to 4d to the tester. The pad 6b that is coupled to the pump chip (PC) 3 receives a pump start signal supplied from the tester. The probe card 2 is provided with a plurality of probe pins 7 which are coupled to the flash memories (FM) 4a to 4d to be tested. The wires 5 serve to couple the plural pads 6 to the plural probe pins 7 and to couple the pump chip (PC) 3 to the plural pads 6.

Next, a test sequence of the test system 1 according to the first exemplary embodiment of the invention is described with reference to the flowchart shown in FIG. 2. In the test sequence, it is assumed that reading operations of the flash memories (FM) 4a to 4d are to be tested.

Figure 2:
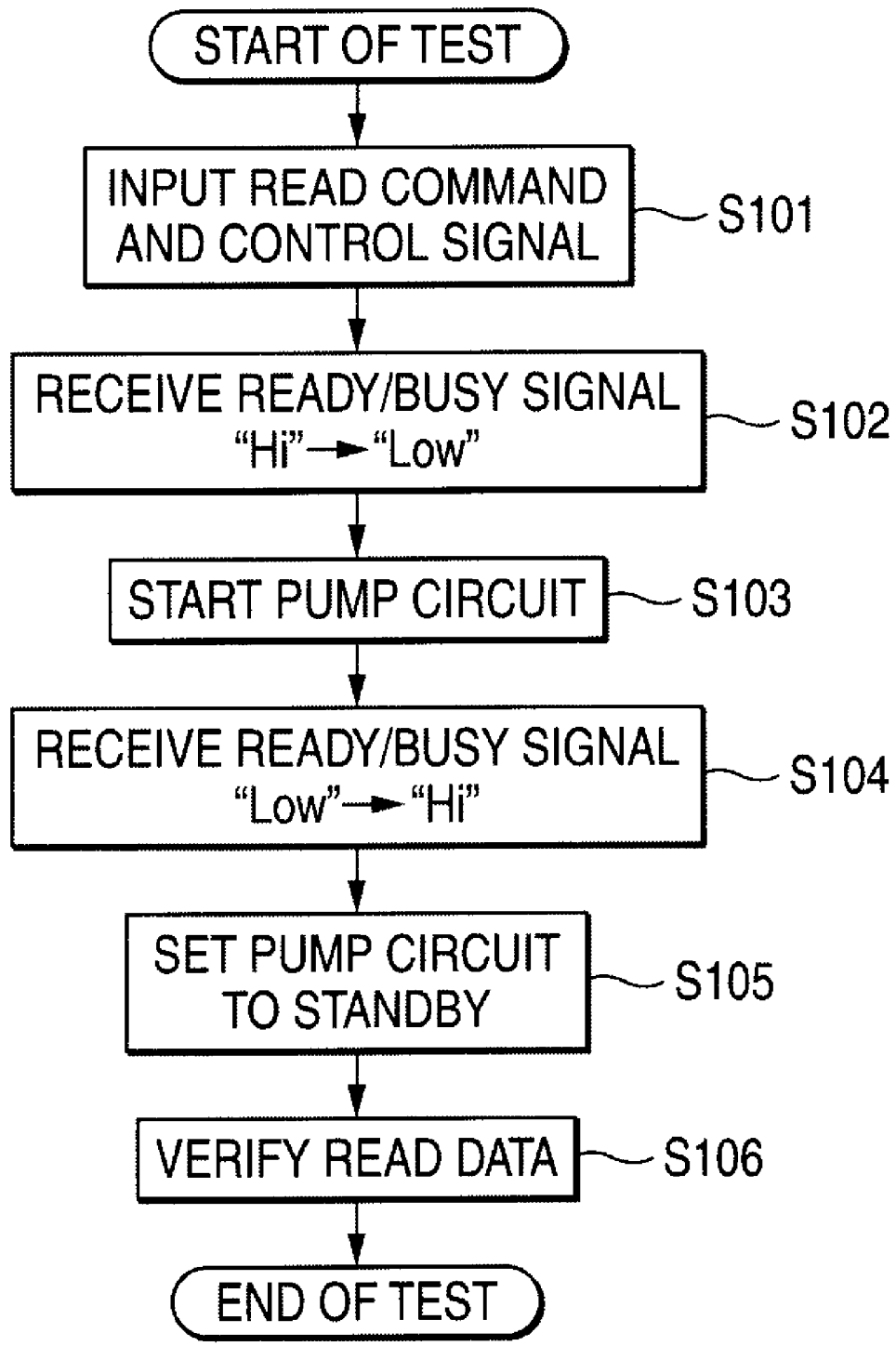
FIG. 2 is a flowchart illustrating a test sequence of the test system according to the first exemplary embodiment of the invention.

As shown in FIG. 2, the tester first inputs a Read command and a control signal to the probe card 2, similarly to a known test, to test the reading operations of the flash memories (FM) 4a to 4d (operation S101). The Read command and the control signal are supplied to the flash memories (FM) 4a to 4d through the pads 6 and the wires 5. When receiving the Read command and the control signal, the flash memories (FM) 4a to 4d set the Ready/Busy signal from the level "Hi" to the level "Low" (operation S102).

The Ready/Busy signal serves to inform devices, in this case the tester, that are outside of the flash memories (FM) 4a to 4d of the internal operation states of the flash memories (FM) 4a to 4d. The Ready/Busy signal is monitored by the tester. The flash memories (FM) 4a to 4d set the Ready/Busy signal from the level "Hi" to the level "Low" during an internal operation such as a programming operation, an erasing operation, and a reading operation, and set the Ready/Busy signal from the level "Low" to the level "Hi" when the internal operation is ended.

When the tester detects that the Ready/Busy signal is changed to the level "Low", the tester inputs a pump start signal to the probe card 2 (operation S103). The pump start signal is supplied to the pump chip (PC) 3 through the pads 6 and the wires 5. When the pump chip (PC) 3 receives the pump start signal, the pump chip (PC) 3 generates a boosting signal Vpmp for reading and supplies the generated boosting signal to the flash memories (FM) 4a to 4d. The flash memories (FM) 4a to 4d perform the reading operations in response to the reading boosting signal and store the read data in an internal register.

When the reading operations are complete, the flash memories (FM) 4a to 4d change the Ready/Busy signal from the level "Low" to the level "Hi" (operation S104). When the tester detects that the Ready/Busy signal is changed to the level "Hi", the tester inputs a standby signal to the probe card 2 to stop the boosting operation of the pump chip (PC) 3 (operation S105). The pump chip (PC) 3 stops the boosting operation when the pump chip (PC) 3 receives the standby signal.

The tester verifies the read data (operation S106). The tester reads the read data stored in the flash memories (FM) 4a to 4d, performs a read data verifying process of comparing the read data with reference data stored in the tester to verify whether the reading operations are normally performed, and ends the test.

In pump chip (PC) 3, it is advantageous that a voltage generating function of generating the boosting signal Vpmp correspond to the test sequence and a function of controlling the voltage generating operation. A circuit configuration for performing these functions is described with reference to FIGS. 3 to 5.

Figure 3A:
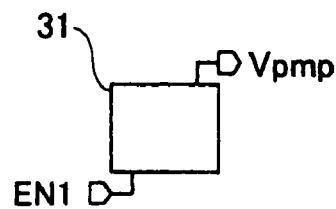
FIG. 3(a) is a diagram illustrating a configuration of a voltage generating circuit according to the first exemplary embodiment.
Figure 3B:
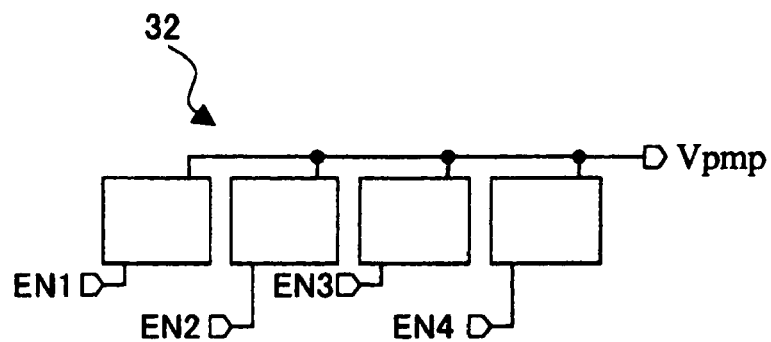
FIG. 3(b) is a diagram illustrating another configuration of the voltage generating circuit.
Figure 4:
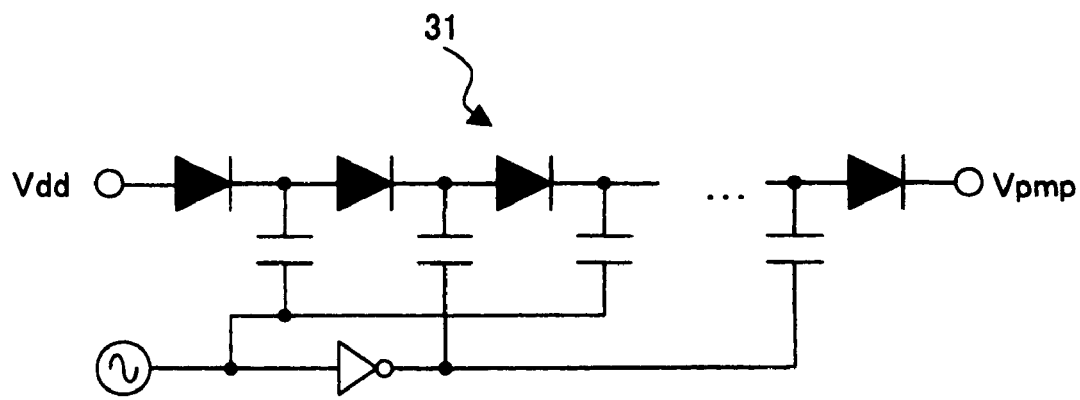
FIG. 4 is a diagram illustrating a circuit configuration of the voltage generating circuit according to the first exemplary embodiment.
Figure 5:
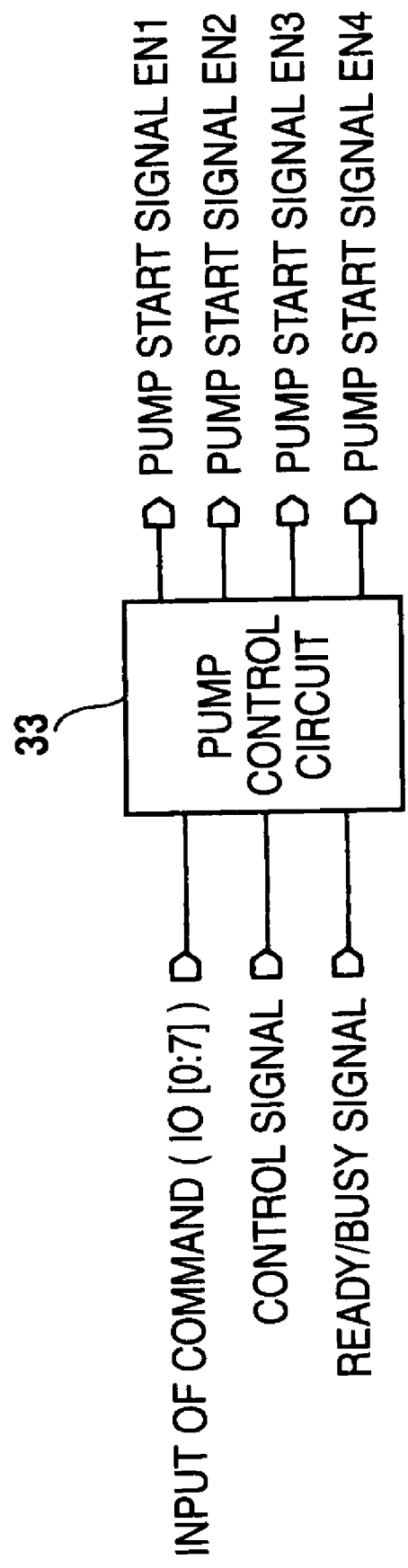
FIG. 5 is a diagram illustrating a configuration of a pump control circuit according to the first exemplary embodiment.

FIGS. 3 and 4 are diagrams illustrating configurations of the voltage generating circuit generating the boosting signal Vpmp. FIG. 3(a) is a block diagram illustrating a schematic configuration of the voltage generating circuit 31, and FIG. 4 is a diagram illustrating a specific circuit configuration of the voltage generating circuit 31. FIG. 3(b) is a diagram illustrating a schematic configuration of a voltage generating circuit 32 when four voltage generating circuits 31 shown in FIG. 3(a) are coupled together in parallel. FIG. 5 is a block diagram illustrating a schematic configuration of a pump control circuit 33 controlling the operation of the voltage generating circuit 31 or the voltage generating circuit 32. The pump chip (PC) 3 comprises the voltage generating circuit 31 or the voltage generating circuit 32, and the pump control circuit 33 built therein.

As shown in FIG. 5, the pump control circuit (i.e., the boosting circuit controller) 33 receives as inputs an input command, a control signal, and a ready/busy signal. The pump control circuit 33 outputs pump start signals EN1 to EN4 for starting the voltage boosting operation of the voltage generating circuit 31 or the voltage generating circuit 32 to the voltage generating circuit 31 or the voltage generating circuit 32, respectively, on the basis of the command and the control signal input from the tester and the Ready/Busy signal input from the flash memories (FM) 4a to 4d.

The voltage generating circuit 31 and the voltage generating circuit 32 perform the voltage boosting operation and output the boosting signal Vpmp when receiving the pump start signal EN1 to EN4 from the pump control circuit 33. The voltage generating circuit shown in FIG. 3(b) generates the boosting signal Vpmp corresponding to one stage when the pump start signals EN1 to EN4 are input individually, and generates the boosting signal Vpmp corresponding to four stages when the pump start signals EN1 to EN4 are input simultaneously. That is, the voltage generating circuit 32 can adjust the capacity of the boosting signal Vpmp supplied from the voltage generating circuit 32 to the flash memories (FM) 4a to 4d to be tested on the basis of the number of the flash memories (FM) 4a to 4d to be tested.

Figure 6:
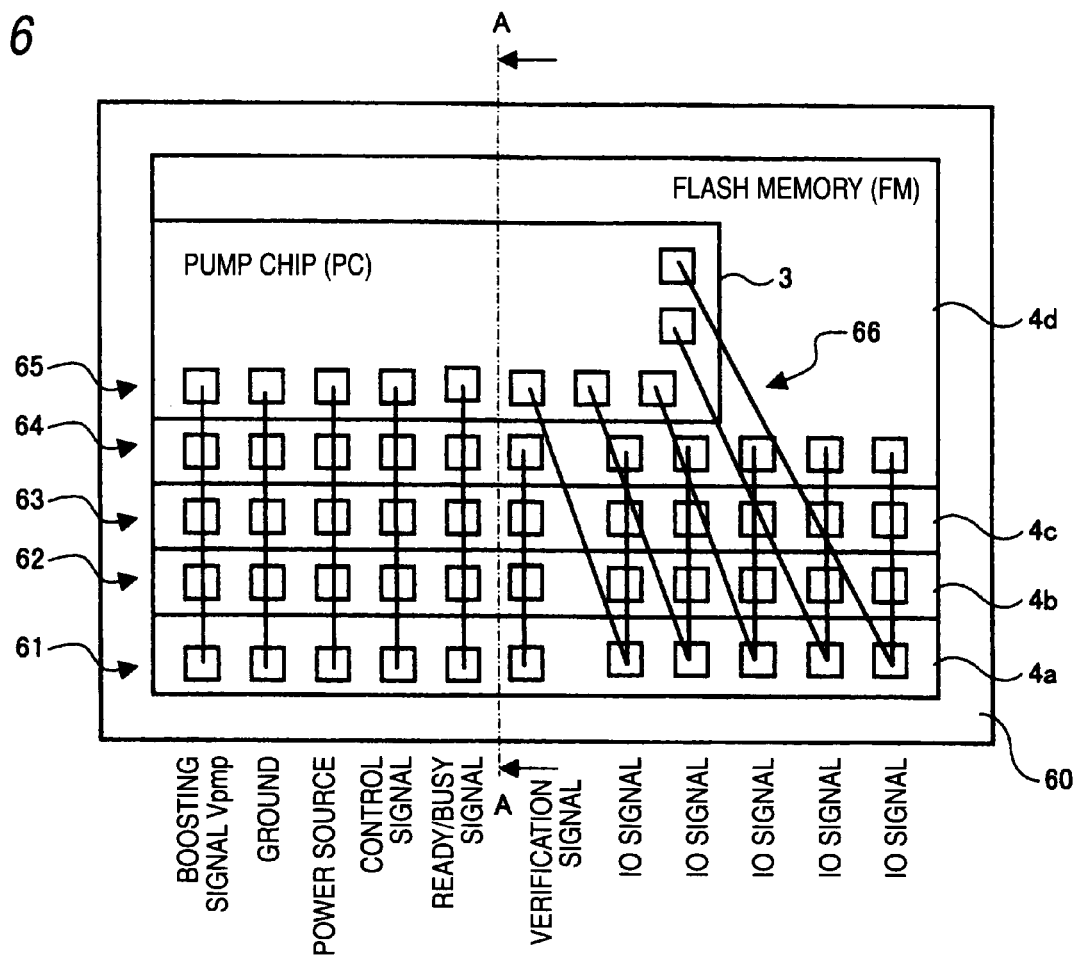
FIG. 6 is a plan view illustrating a configuration of a multi-chip package including a pump chip and a flash memory according to the first exemplary embodiment.

FIG. 6 is a plan view illustrating a connection state of a chip where a multi-chip package comprises the pump chip (PC) 3 and the flash memories (FM) 4a to 4d shown in FIG. 1. A multi-chip package substrate (MCP substrate) 60 comprises the flash memories (FM) 4a to 4d and the pump chip (PC) 3 stacked in this order on the multi-chip package substrate 60. Groups of pads 61 to 64 are disposed in the lower region in the figure on the respective flash memories (FM) 4a to 4d and a group of pads 65 is disposed on the pump chip (PC) 3. The groups of pads 61 to 65 serve to receive and transmit a variety of signals such as a ground, a power source, a verification signal, the Ready/Busy signal, the boosting signal Vpmp, and an input/output (IO) signal (command) shown in FIG. 6. The groups of pads 61 to 65 are coupled to each other through bonding wires 66.

Figure 7:
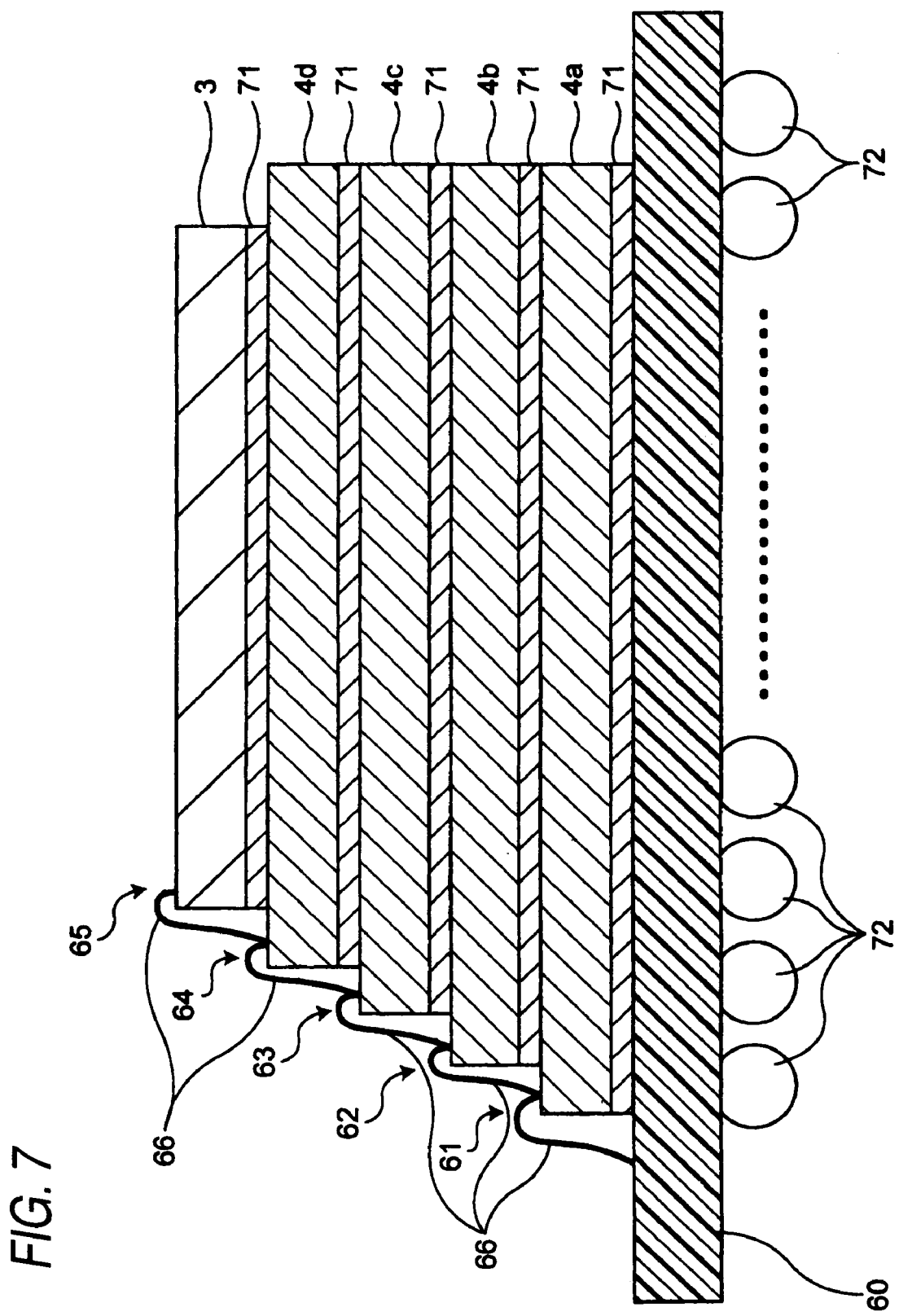
FIG. 7 is a perspective sectional view taken along line A-A of FIG. 6 according to the first exemplary embodiment.

FIG. 7 is a perspective sectional view taken along line A-A of FIG. 6. As shown in FIG. 7, the flash memories (FM) 4a to 4d are sequentially stacked with interlayer films 71 interposed between each of the flash memories (FM) 4a to 4d on the MCP substrate 60 and the pump chip (PC) 3 is stacked on the uppermost layer. In other words, an interlayer film 71 is disposed on the MCP substrate 60, and the flash memories (FM) 4a to 4d are interleaved with additional layers of the interlayer film 71. An final layer of interlayer film 71 is disposed on top of the flash memory (FM) 4d and the pump chip (PC) 3 is disposed on top of the final layer of interlayer film 71. The flash memories (FM) 4a to 4d are stacked in a step shape in the left region of FIG. 6 (lower region in FIG. 6) and the groups of pads 61 to 64 are disposed in the step shaped region as described above. A plurality of bumps 72 are formed on the bottom surface of the MCP substrate 60. The pump chip (PC) 3 shown in FIGS. 6 and 7 comprises the voltage generating circuit 32 and the pump control circuit 33.

According to the configuration shown in FIGS. 6 and 7, a pump circuit is not provided for each of the flash memories (FM) 4a to 4d. As a result, it is possible to reduce the mounting areas of the flash memories (FM) 4a to 4d, thereby reducing the chip cost. The configuration of the multi-chip package shown in FIGS. 6 and 7 is only an example and does not limit the stacked structure of the flash memories and the structures of the pads and the bonding wires.

Figure 8:
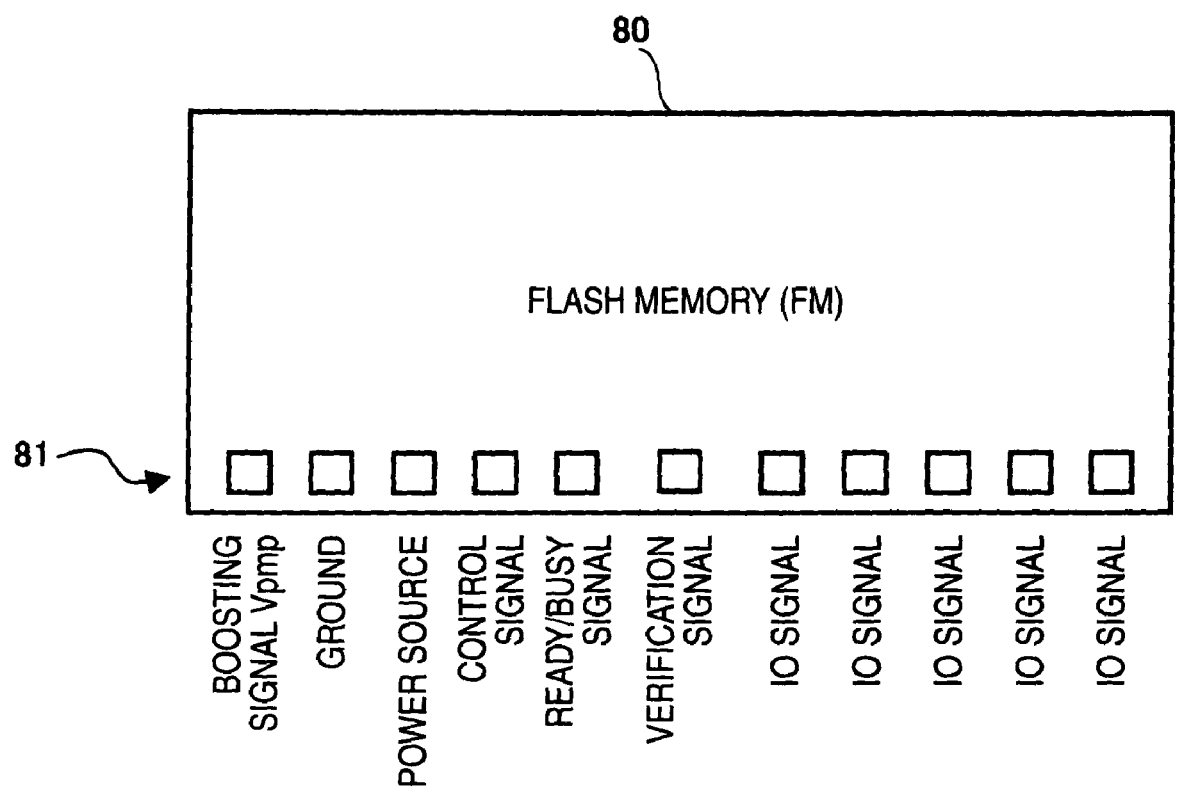
FIG. 8 is a plan view illustrating a configuration of a package of the flash memory not including the pump circuit according to the first exemplary embodiment.

As shown in FIG. 8, the flash memories (FM) 4a to 4d may be provided in a package with the pump chip (PC) omitted therefrom. A flash memory (FM) 80 comprises pads 81 for receiving and transmitting a variety of signals such as a control signal, a boosting signal Vpmp, a ground signal, a power supply signal, a Ready/Busy signal, a verification signal, and an IO signal (command). In this case, the pump chip (PC) 3 is formed in another chip package and the boosting signal Vpmp is supplied from the pump chip (PC) 3 to the flash memory (FM) 80. As a result, it is possible to further reduce the chip cost for the flash memory (FM) 80.

Reading operation tests for the flash memories (FM) 4a to 4d will now be described with reference the timing diagram shown in FIG. 9. The reading operation tests are performed in parallel in the test system 1 shown in FIG. 1. FIG. 9(a) shows a waveform of a reference clock signal Clock associated with the reading operations of the flash memories (FM) 4a to 4d, FIG. 9(b) shows a waveform of a Read command/control signal supplied from the tester, FIG. 9(c) shows a waveform of a Ready/Busy signal 1 output from the flash memory (FM) 4a, FIG. 9(d) shows a waveform of a pump start signal EN1 output from the pump control circuit 33, FIG. 9(e) shows a waveform of a Ready/Busy signal 2 output from the flash memory (FM) 4b, FIG. 9(f) shows a waveform of a pump start signal EN2 output from the pump control circuit 33, FIG. 9(g) shows a waveform of a Ready/Busy signal 3 output from the flash memory (FM) 4c, FIG. 9(h) shows a waveform of a pump start signal EN3 output from the pump control circuit 33, FIG. 9(i) shows a waveform of a Ready/Busy signal 4 output from the flash memory (FM) 4d, FIG. 9(j) shows a waveform of a pump start signal EN4 output from the pump control circuit 33, and FIG. 9(k) shows a waveform of a waveform of a boosting signal Vpmp output from the voltage generating circuit 32. In the timing diagram, it is assumed that the reading operation tests for the flash memories (FM) 4a to 4d are performed in parallel.

Figure 9:
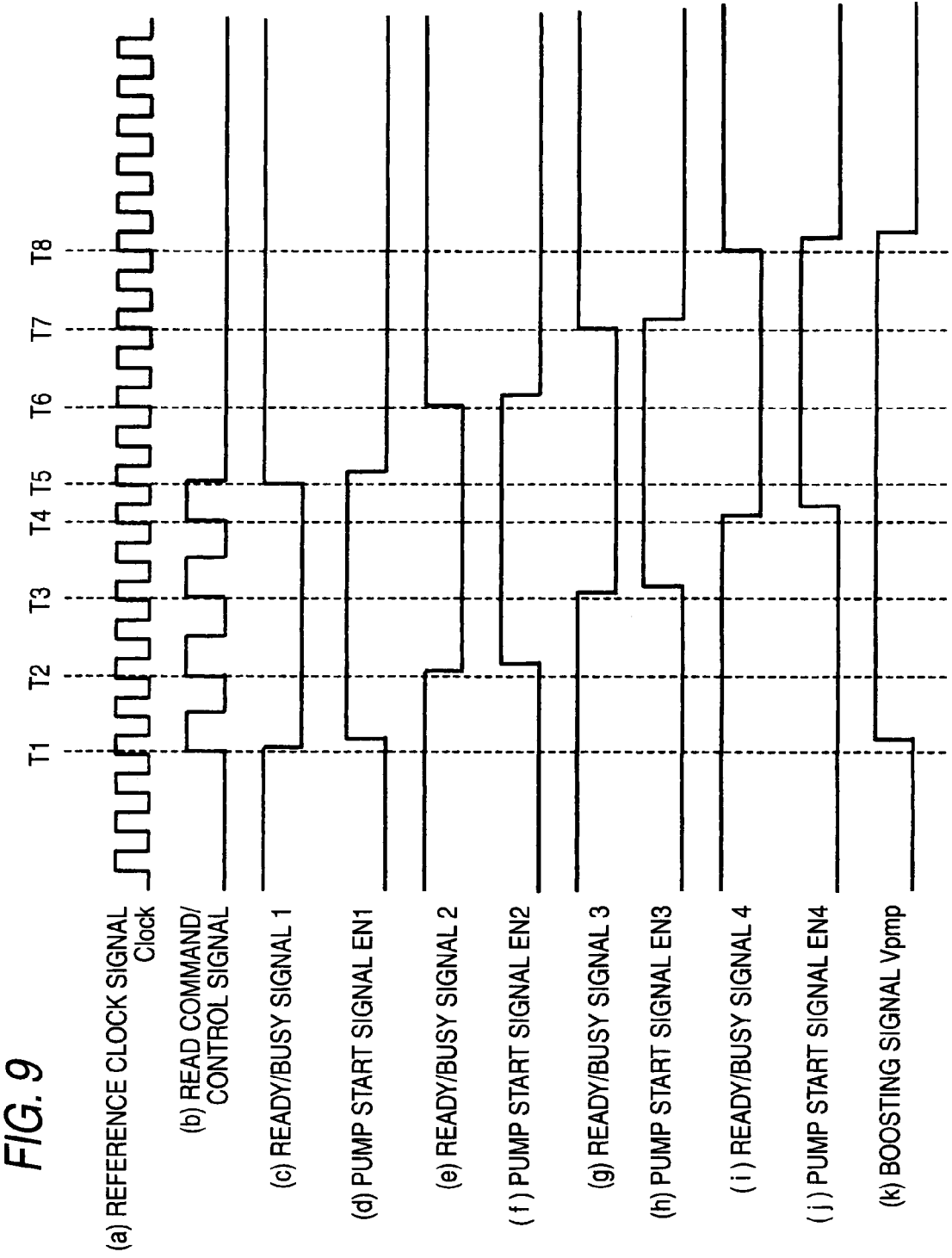
FIG. 9 is a timing diagram illustrating the test sequence according to the first exemplary embodiment, where

In FIG. 9, it is assumed that the tester performs the reading operations of the flash memories (FM) 4a to 4d in synchronization with a rising edge of the pulse of the reference clock signal Clock. The tester outputs the Read command/control signal to the flash memory (FM) 4a in synchronization with the rising edge T1 of the pulse of the reference clock signal Clock. The Read command/control signal includes a chip selecting command for selecting the flash memory (FM) 4a or a column address and a page address of a data reading source in the flash memory (FM) 4a.

The flash memory (FM) 4a sets the Ready/Busy signal 1 from the level "Hi" to the level "Low" after receiving the Read command/control signal. The pump control circuit 33 of the pump chip (PC) 3 outputs the pump start signal EN1 ("Hi" signal) to the voltage generating circuit 32 after detecting that the Ready/Busy signal 1 is changed from the level "Hi" to the level "Low". The voltage generating circuit 32 generates the boosting signal Vpmp by the use of the voltage generating circuit (the circuit at the left end in FIG. 3(b)) corresponding to one stage and supplies the generated boosting signal to the flash memories (FM) 4a to 4d, after receiving the pump start signal EN1.

Then, the tester outputs the Read command/control signal to the flash memory (FM) 4b in synchronization with the rising edge T2 of the pulse of the reference clock signal Clock. The Read command/control signal comprises a chip selecting command for selecting the flash memory (FM) 4b or a column address and a page address of a data reading source in the flash memory (FM) 4b.

The flash memory (FM) 4b sets the Ready/Busy signal 2 from the level "Hi" to the level "Low" after receiving the Read command/control signal. The pump control circuit 33 of the pump chip (PC) 3 outputs the pump start signal EN2 ("Hi" signal) to the voltage generating circuit 32 after detecting that the Ready/Busy signal 2 is changed from the level "Hi" to the level "Low". The voltage generating circuit 32 generates the boosting signal Vpmp by the use of the voltage generating circuit (the circuit at the left end and the right neighboring circuit thereof in FIG. 3(b)) corresponding to two stages and supplies the generated boosting signal to the flash memories (FM) 4a to 4d, after receiving the pump start signal EN2.

Then, the tester outputs the Read command/control signal to the flash memory (FM) 4c in synchronization with the rising edge T3 of the pulse of the reference clock signal Clock. The Read command/control signal includes a chip selecting command for selecting the flash memory (FM) 4c or a column address and a page address of a data reading source in the flash memory (FM) 4c.

The flash memory (FM) 4c sets the Ready/Busy signal 3 from the level "Hi" to the level "Low" after receiving the Read command/control signal. The pump control circuit 33 of the pump chip (PC) 3 outputs the pump start signal EN3 ("Hi" signal) to the voltage generating circuit 32 after detecting that the Ready/Busy signal 3 is changed from the level "Hi" to the level "Low". The voltage generating circuit 32 generates the boosting signal Vpmp by the use of the voltage generating circuit (the circuits other than the circuit at the right end in FIG. 3(b)) corresponding to three stages and supplies the generated boosting signal to the flash memories (FM) 4a to 4d, after receiving the pump start signal EN3.

Then, the tester outputs the Read command/control signal to the flash memory (FM) 4d in synchronization with the rising edge T4 of the pulse of the reference clock signal Clock. The Read command/control signal includes a chip selecting command for selecting the flash memory (FM) 4d or a column address and a page address of a data reading source in the flash memory (FM) 4d.

The flash memory (FM) 4d sets the Ready/Busy signal 4 from the level "Hi" to the level "Low" after receiving the Read command/control signal. The pump control circuit 33 of the pump chip (PC) 3 outputs the pump start signal EN4 ("Hi" signal) to the voltage generating circuit 32 after detecting that the Ready/Busy signal 4 is changed from the level "Hi" to the level "Low". The voltage generating circuit 32 generates the boosting signal Vpmp by the use of the voltage generating circuit (all the circuits in FIG. 3(b)) corresponding to four stages and supplies the generated boosting signal to the flash memories (FM) 4a to 4d, after receiving the pump start signal EN4.

When the boosting signal Vpmp is sequentially supplied from the voltage generating circuit 32, the flash memories (FM) 4a to 4d sequentially perform a data reading operation on the basis of the column address and the page address of the data reading source included in the previously received Read command/control signal. The respective flash memories (FM) 4a to 4d select the corresponding column address and the corresponding page address in a memory cell array thereof, sequentially read data stored in the memory cells, and sequentially store the read data in the inner register. The flash memory (FM) 4a sets the Ready/Busy signal 1 from the level "Low" to the level "Hi" (time T5 in the figure), after ending the reading operation.

After detecting that the Ready/Busy signal 1 is changed from the level "Low" to the level "Hi", the pump control circuit 33 stops the output of the pump start signal EN1 (i.e., changes the pump start signal EN1 to the level "Low"). After the pump start signal EN1 is stopped, the voltage generating circuit 32 stops the boosting operation of the first-stage voltage generating circuit (the circuit at the left end in FIG. 3(b)) and continues to perform the boosting operation of the other three-stage voltage generating circuits.

Then, after ending the reading operation, the flash memory (FM) 4b sets the Ready/Busy signal 2 from the level "Low" to the level "Hi" (time T6 in the figure). After detecting that the Ready/Busy signal 2 is changed from the level "Low" to the level "Hi", the pump control circuit 33 stops the output of the pump start signal EN2 (the level "Low"). After the pump start signal EN2 is stopped, the voltage generating circuit 32 stops the boosting operation of the second-stage voltage generating circuit (the second circuit from the left end in FIG. 3(b)) and continues to perform the boosting operation of the other two-stage voltage generating circuits.

Then, after ending the reading operation, the flash memory (FM) 4c sets the Ready/Busy signal 3 from the level "Low" to the level "Hi" (time T7 in the figure). After detecting that the Ready/Busy signal 3 is changed from the level "Low" to the level "Hi", the pump control circuit 33 stops the output of the pump start signal EN3 (the level "Low"). After the pump start signal EN3 is stopped, the voltage generating circuit 32 stops the boosting operation of the third-stage voltage generating circuit (the second circuit from the right end in FIG. 3(b)) and continues to perform the boosting operation of the other one-stage voltage generating circuit.

Then, after ending the reading operation, the flash memory (FM) 4d sets the Ready/Busy signal 4 from the level "Low" to the level "Hi" (time T8 in the figure). After detecting that the Ready/Busy signal 4 is changed from the level "Low" to the level "Hi", the pump control circuit 33 stops the output of the pump start signal EN4 (the level "Low"). After the pump start signal EN4 is stopped, the voltage generating circuit 32 stops the boosting operation of the one-stage voltage generating circuit (the circuit at the right end in FIG. 3(b)) to stop the boosting signal Vpmp supplied to the flash memories (FM) 4a to 4d.

Next, the tester reads data stored in the inner registers of the flash memories (FM) 4a to 4d and performs the read data verifying process of comparing the read data with the reference data stored in the tester and verifying whether the reading operation is normally performed.

Although it has been shown in FIG. 9 that the reading operation tests of the flash memories (FM) 4a to 4d are performed in parallel, the reading operation test of the flash memories (FM) 4a to 4d may be performed sequentially. That is, in the first exemplary embodiment of the invention, since the pump chip (PC) 3 includes the voltage generating circuit 32 capable of simultaneously supplying the boosting signal Vpmp to the operations of the flash memories (FM) 4a to 4d, it is possible to perform both a parallel operation test of the plurality of flash memories (FM) 4a to 4d selected from the flash memories (FM) 4a to 4d and a sequential operation test of the flash memories (FM) 4a to 4d.

As described above, in the flash memory using the pump chip according to the first exemplary embodiment of the invention, it is possible to implement the probe card and the multi-chip package in which the pump circuit having been disposed in the flash memory is taken out as a pump chip and one pump chip is shared by the plurality of flash memories. Accordingly, it is possible to reduce the chip area of the flash memories and to reduce the manufacturing cost thereof. Since one pump chip is shared by the plurality of flash memories, it is possible to reduce the manufacturing cost of the multi-chip package. The probe card 2 and the pump chip (PC) 3 comprise a part of a tester to implement a semiconductor tester.

Second Exemplary Embodiment

In a second exemplary embodiment of the invention, a configuration for verifying whether the voltage level of the boosting signal Vpmp generated from the pump chip (PC) 3 is within a threshold reference voltage level is added to the test system 1.

Figure 10:
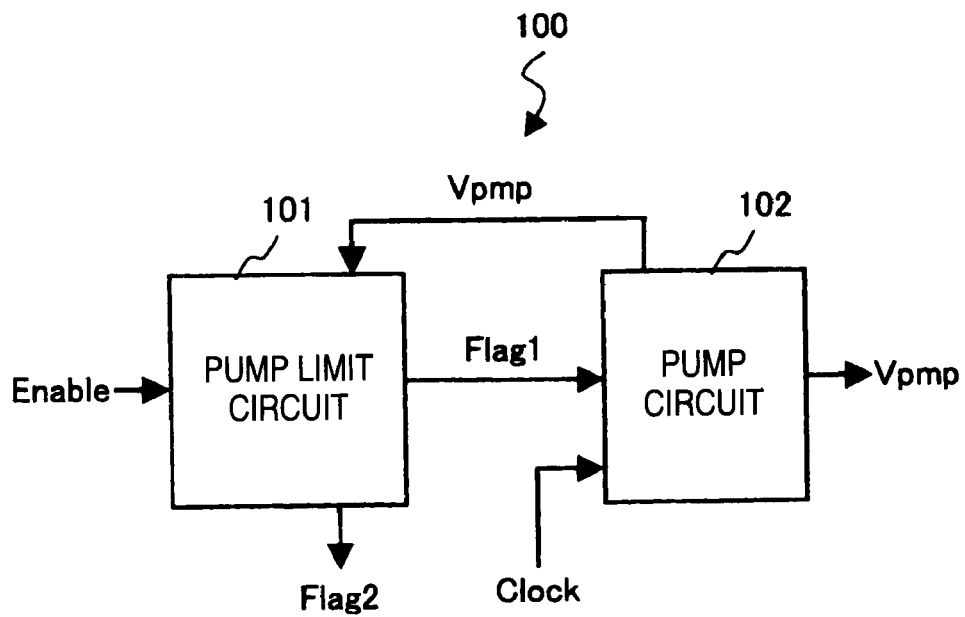
FIG. 10 is a block diagram illustrating a configuration of a pump chip according to a second exemplary embodiment of the invention.

FIG. 10 is a block diagram illustrating a schematic configuration of a pump chip 100 according to the second exemplary embodiment of the invention. The pump chip 100 comprises a pump limit circuit 101 and a pump circuit 102. The configuration of a test system 1 according to the second exemplary embodiment other than the configuration of the pump chip 100 is similar to the configuration of the test system 1 shown in FIG. 1 according to the first exemplary embodiment and thus the illustration and description thereof is omitted.

Figure 11A:
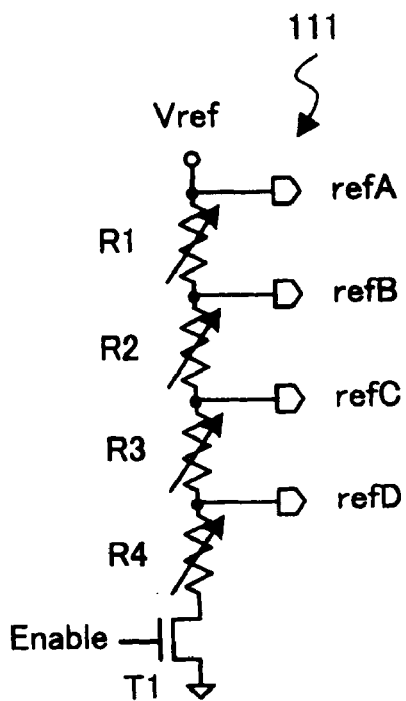
FIG. 11(a) is a diagram illustrating a circuit configuration of a reference voltage setting circuit included in a pump limit circuit according to the second exemplary embodiment and FIG. 11(b) is a diagram illustrating a circuit configuration of a pump output detecting circuit according to the second exemplary embodiment.
Figure 11B:
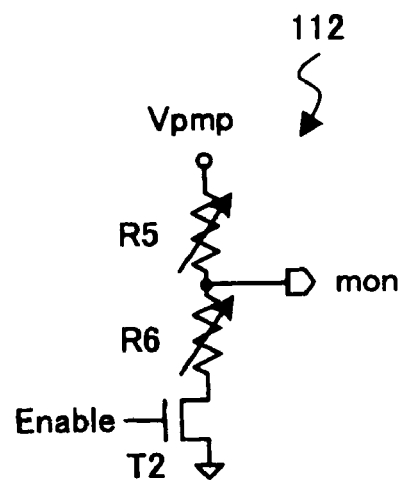
Figure 12:
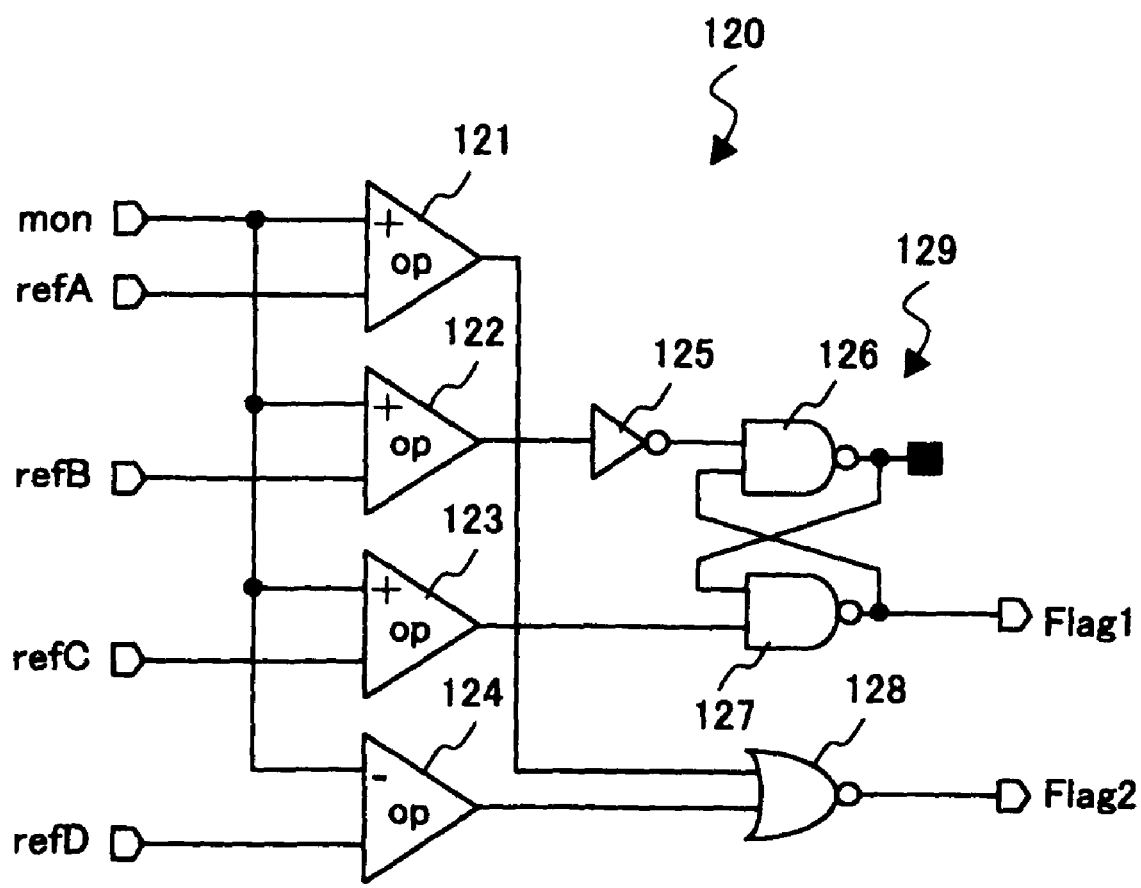
FIG. 12 is a diagram illustrating a circuit configuration of a pump output comparing circuit included in the pump limit circuit according to the second exemplary embodiment.

The pump limit circuit 101 comprises a reference voltage setting circuit 111 shown in FIG. 11(a), a pump output detecting circuit 112 shown in FIG. 11(b), and a pump output comparing circuit 120 shown in FIG. 12.

Figure 13:
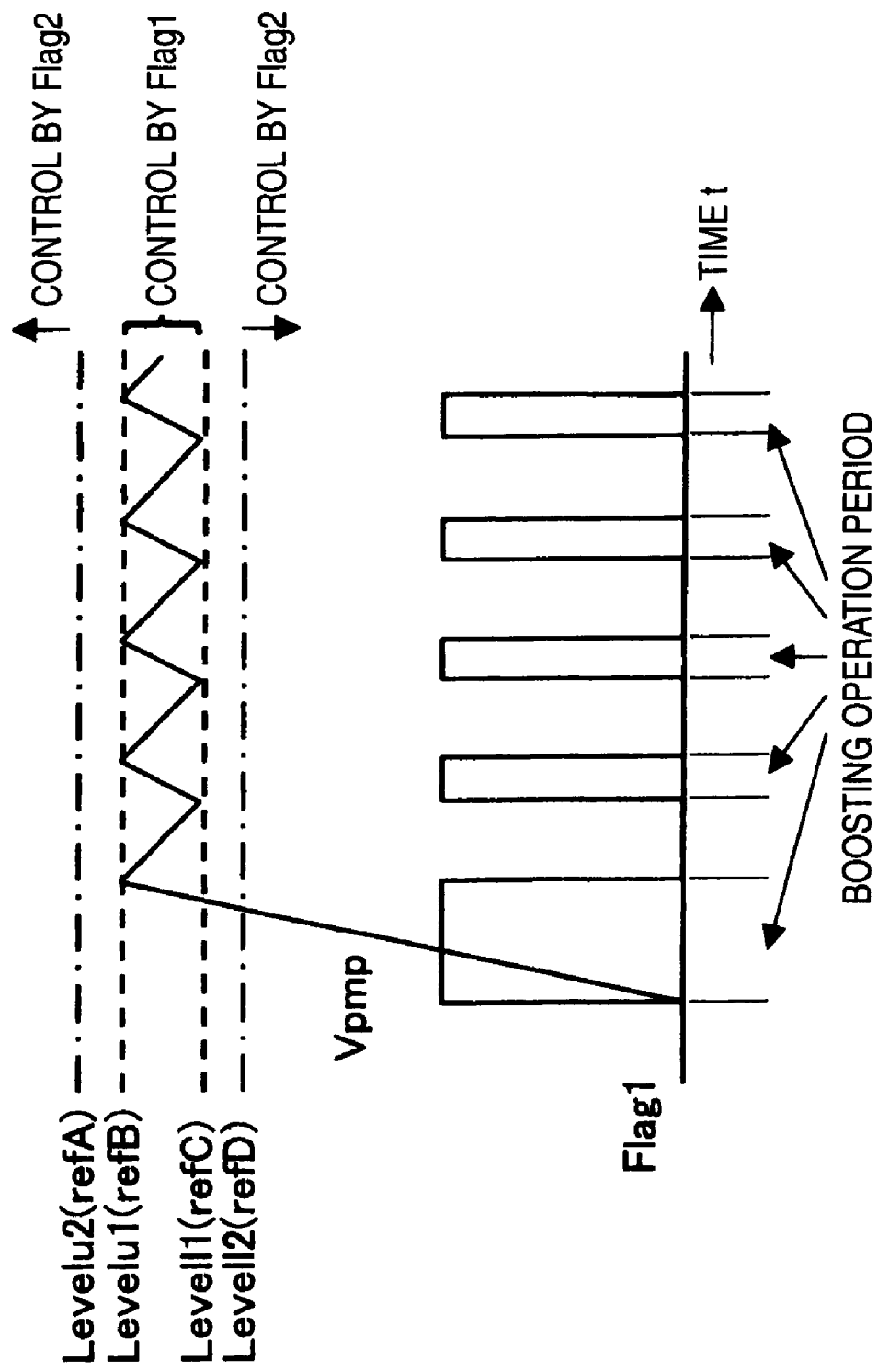
FIG. 13 is a diagram illustrating an operation of the pump output comparing circuit shown in FIG. 12 according to the second exemplary embodiment.

The reference voltage setting circuit 111 shown in FIG. 11(a) comprises resistors R1 to R4 and a transistor T1. The reference voltage setting circuit 111 divides a reference voltage Vref input to the upper terminal in the figure by the use of intermediate nodes of the resistors R1 to R4 which are coupled together in series and outputs a first reference voltage refA, a second reference voltage refB, a third reference voltage refC, and a fourth reference voltage refD from the intermediate nodes, respectively. The voltage levels of the first reference voltage refA, the second reference voltage refB, the third reference voltage refC, and the fourth reference voltage refD satisfy the relation refA>refB>refC>refD, as shown in FIG. 13. In FIG. 13, the first reference voltage refA to the fourth reference voltage refD correspond to levelu2, levelu1, levell1, and levell2 for setting detection comparison levels of the boosting signal Vpmp. The levelu2 and levelu1 of the detection comparison levels are used to set an upper limit of the boosting signal Vpmp. The levell1 and levell2 are used to set a lower limit of the boosting signal Vpmp. In the reference voltage setting circuit 111, if an enable signal Enable that is input from the tester is at the level "Hi", the transistor T1 is turned on to supply the first to fourth reference voltages refA to refD to the pump output comparing circuit 120. The resistors R1 to R4 shown in FIG. 11(a) permit the resistance values to be varied depending on the designed operation voltage levels of the flash memories (FM) 4a to 4d.

The pump output detecting circuit 112 shown in FIG. 11(b) comprises resistors R5 and R6 and a transistor T2. The pump output detecting circuit 112 receives the boosting signal Vpmp output from the pump circuit 102 through the upper terminal in the figure, divides the voltage of the boosting signal by the use of the intermediate node between the resistors R5 and R6 which are coupled together in series, and outputs a pump output detecting signal mon from the intermediate node. In the pump output detecting circuit 112, when the enable signal Enable input from the tester is at the level "Hi", the transistor T2 is turned on to supply the pump output detecting signal mon to the pump output comparing circuit 120. The resistors R5 and R6 shown in FIG. 11(b) allow the resistance values thereof to be varied depending on the designed operation voltage level of the boosting signal Vpmp of the pump circuit 102.

The pump output comparing circuit 120 shown in FIG. 12 comprises operational amplifiers 121 to 124, an inverter circuit 125, NAND circuits 126 and 127, and a NOR circuit 128. In the pump output comparing circuit 120, the non-inverted input terminals (+) of the operational amplifiers 121 to 123 and the inverted input terminal (−) of the operational amplifier 124 are supplied with the pump output detecting signal mon from the pump output detecting circuit 112, the inverted input terminals (−) of the operational amplifiers 121 to 123 are supplied with the first reference voltage refA, the second reference voltage refB, and the third reference voltage refC from the reference voltage setting circuit 111, respectively, and the non-inverted input terminal (+) of the operational amplifier 124 is supplied with the fourth reference voltage refD from the reference voltage setting circuit 111.

The operational amplifier 121 compares the pump output detecting signal mon with the first reference voltage refA, outputs a "Low" signal as the comparison result to the NOR circuit 128 if the pump output detecting signal mon is less than or equal to the first reference voltage refA (levelu2), and outputs a "Hi" signal as the comparison result to the NOR circuit 128 if the pump output detecting signal mon is greater than the first reference voltage refA (levelu2).

The operational amplifier 122 compares the pump output detecting signal mon with the second reference voltage refB, outputs a "Low" signal as the comparison result to the inverter circuit 125 if the pump output detecting signal mon is less than or equal to the second reference voltage refB (levelu1), and outputs a "Hi" signal as the comparison result to the inverter circuit 125 if the pump output detecting signal mon is greater than the second reference voltage refB (levelu1).

The operational amplifier 123 compares the pump output detecting signal mon with the third reference voltage refC, outputs a "Hi" signal as the comparison result to the NAND circuit 127 if the pump output detecting signal mon is greater than or equal to the third reference voltage refC (levell1), and outputs a "Low" signal as the comparison result to the NAND circuit 127 if the pump output detecting signal mon is less than the third reference voltage refC (levell1).

The operational amplifier 124 compares the pump output detecting signal mon with the fourth reference voltage refD, outputs a "Low" signal as the comparison result to the NOR circuit 128 if the pump output detecting signal mon is greater than or equal to the fourth reference voltage refD (levell2), and outputs a "Hi" signal as the comparison result to the NOR circuit 128 if the pump output detecting signal mon is less than the fourth reference voltage refD (levell2).

The NAND circuits 126 and 127 comprise a latch circuit 129. The latch circuit 129 receives an inverted signal of the comparison result of the operational amplifier 122 input through the inverter circuit 125 from an input terminal, receives the comparison result of the operational amplifier 123 from the other input terminal, and outputs a flag signal Flag1 for controlling the boosting operation of the pump circuit 102 to the pump circuit 102 on the basis of the inverted signal of the comparison result and the comparison result.

In the second exemplary embodiment of the invention, the latch circuit 129 latches the "Hi" signal input as the inverted signal of the comparison result from the inverter circuit 125 (when the operational amplifier 123 outputs the "Hi" signal) if the pump output detecting signal mon is less than or equal to the second reference voltage refB (levelu1), and outputs the "Hi" signal as a flag signal Flag1 to the pump circuit 102 to perform the boosting operation. The latch circuit 129 latches the "Low" signal input as the inverted signal of the comparison result from the inverter circuit 125 (when the operational amplifier 123 outputs the "Hi" signal) if the pump output detecting signal mon is greater than the second reference voltage refB (levelu1), and outputs the "Low" signal as the flag signal Flag1 to the pump circuit 102 to stop the boosting operation. If the pump output detecting signal mon is less than the third reference voltage refC (levell1), the latch circuit 129 receives the "Low" signal as the comparison result from the operational amplifier 123 but receives the "Hi" signal from the inverter circuit 125. Accordingly, the latch circuit latches the "Hi" signal and outputs the "Hi" signal as the flag signal Flag1 to the pump circuit 102 to restart the boosting operation.

By repeating the above-mentioned operations of the operational amplifiers 122 and 123 and the latch circuit 129, the voltage level of the boosting signal Vpmp output from the pump circuit 102 is controlled to be in the range between the levelu1 (i.e., the second reference voltage refB) and the levell1 (i.e., the third reference voltage refC), as shown in FIG. 13.

If the pump output detecting signal mon is greater than the first reference voltage refA (levelu2) and the "Hi" signal (when the operation amplifier 124 outputs the "Low" signal) is input as the comparison result from the operation amplifier 121, the NOR circuit 128 outputs a flag signal Flag2, which indicates that the boosting signal Vpmp output from the pump circuit 102 is abnormal, as the "Low" to the tester. If the pump output detecting signal mon is less than the fourth reference voltage refD (levell2) and the "Hi" signal (when the operation amplifier 121 outputs the "Low" signal) is input as the comparison result from the operation amplifier 124, the NOR circuit 128 outputs the flag signal Flag2, which indicates that the boosting signal Vpmp output from the pump circuit 102 is abnormal, as the "Low" to the tester. That is, the pump chip 100 according to the second exemplary embodiment has a function of informing the tester of the flag signal Flag2, which indicates that the pump circuit 102 does not operate normally, by outputting the "Low" signal to the tester, if the voltage level of the boosting signal Vpmp output from the pump circuit 102 is greater than the first reference voltage refA (levelu2) or less than the fourth reference voltage refD (levell2).

Next, a test sequence of the test system 1 according to the second exemplary embodiment will be described with reference to the flowchart shown in FIG. 14. In the test sequence, it is assumed that the reading operations of the flash memories (FM) 4a to 4d are tested.

Figure 14:
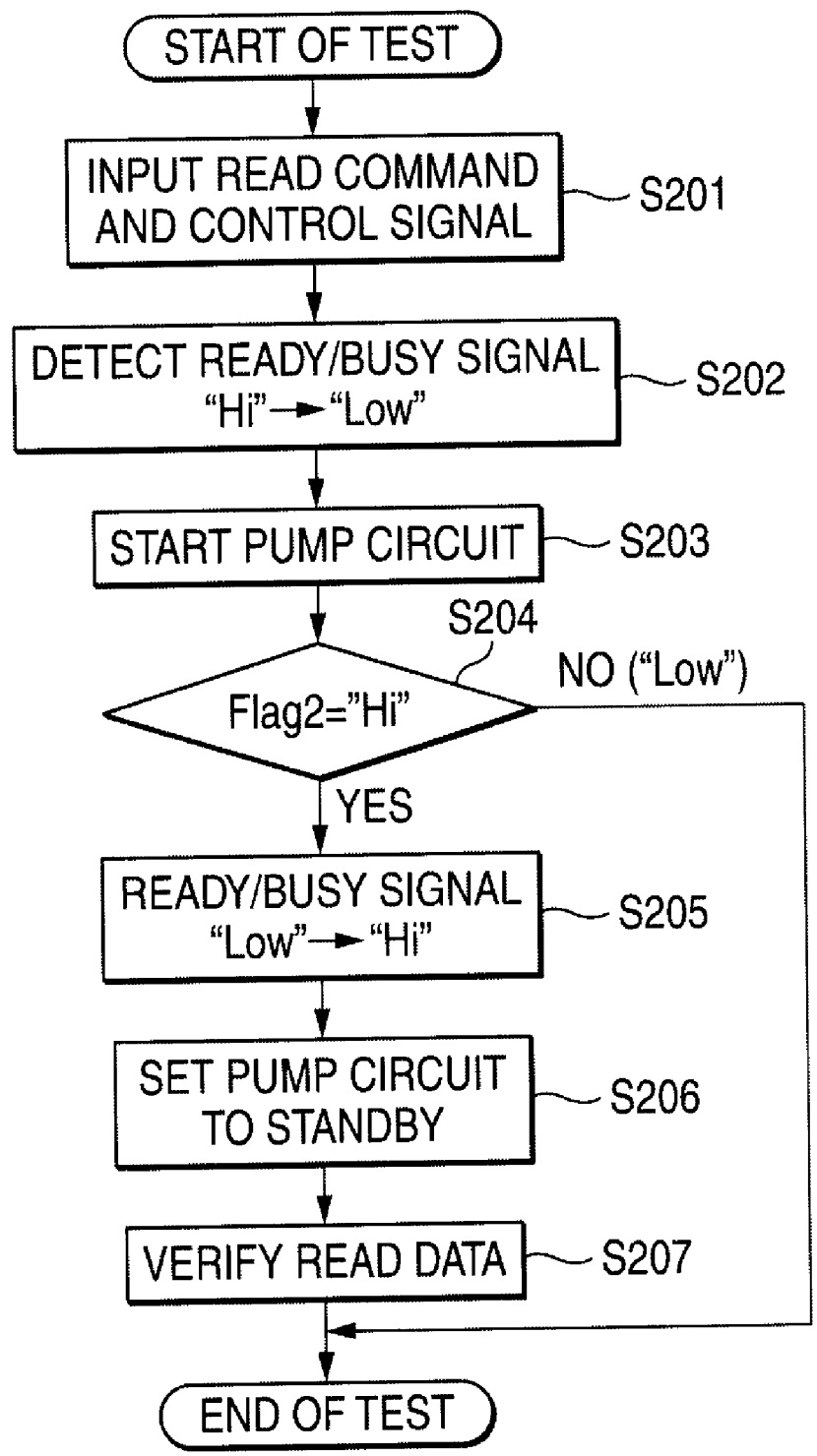
FIG. 14 is a flowchart illustrating a test sequence of a test system according to the second exemplary embodiment.

As shown in FIG. 14, in order to test the reading operations of the flash memories (FM) 4a to 4d, the tester inputs the Read command/control signal to the probe card 2 (operation S201), similar to the known test. The Read command/control signal is supplied to the flash memories (FM) 4a to 4d through the pads 6 and the wires 5. After receiving the Read command/control signal, the flash memories (FM) 4a to 4d set the Ready/Busy signal from the level "Hi" to the level "Low" (operation S202).

Then, after detecting that the Ready/Busy signal is changed to the level "Low", the tester inputs the pump start signal to the probe card 2 (operation S203). The pump start signal is supplied to the pump chip 100 through the pads 6 and the wires 5. After receiving the pump start signal, the pump chip 100 generates a reading boosting signal Vpmp and supplies the generated reading boosting signal to the flash memories (FM) 4a to 4d. After receiving the reading boosting signal, the flash memories (FM) 4a to 4d perform the reading operation and store the read data in the internal registers thereof.

In the pump chip 100, when the reading boosting signal Vpmp is supplied to the flash memories (FM) 4a to 4d, the pump output comparing circuit 120 of the pump limit circuit 101 controls the voltage level of the boosting signal Vpmp and monitors whether the voltage level of the boosting signal Vpmp is normal. In the pump chip 100, if the voltage level of the boosting signal Vpmp is abnormal, that is, if the voltage level of the boosting signal Vpmp is greater than the first reference voltage refA (levelu2) or less than the fourth reference voltage refD (levell2), the flag signal Flag2 is sent as the "Low" signal to the tester.

Then, the tester determines whether the flag signal Flag2 input from the pump chip 100 is the "Hi" signal (operation S204). That is, the tester confirms whether the boosting operation of the pump chip 100 is normal on the basis of the flag signal Flag2 input from the pump chip 100. If it is determined that the flag signal Flag2 is "Hi" signal (Yes in operation S204), operation S205 is performed. On the other hand, if it is determined that the flag signal Flag2 is "Low" (No in operation S204), the tester ends the test sequence. This is because the boosting operation of the pump chip 100 is abnormal.

At operation S205, the flash memories (FM) 4a to 4d change the Ready/Busy signal from the level "Low" to the level "Hi". After detecting that the Ready/Busy signal is changed to the level "Hi", the tester inputs a standby signal to the probe card 2 (operation S206) to stop the boosting operation of the pump chip 100. The pump chip 100 stops the boosting operation after receiving the standby signal.

Then, the tester verifies the read data (operation S207). The tester reads the read data stored in the flash memories (FM) 4a to 4d, performs the read data verifying process of comparing the read data with the reference data stored in the tester to verify whether the reading operations are normally performed, and ends the test.

As described above, in the flash memory employing the pump chip according to the second exemplary embodiment, it is possible to implement the probe card and the multi-chip package in which the pump circuit having been disposed in the flash memory is taken out as a pump chip and one pump chip is shared by the plurality of flash memories. Accordingly, it is possible to reduce the chip area of the flash memories and to reduce the manufacturing cost. In addition, since one pump chip is shared by the plurality of flash memories, it is possible to reduce the manufacturing cost of the multi-chip package.

In the test system of the flash memory employing the pump chip according to the second exemplary embodiment, since the pump limit circuit 101 having a function of controlling the voltage level of the boosting signal Vpmp to be in a threshold range and a function of informing the abnormality of the boosting operation is disposed in the pump chip 100, it is possible to improve the reliability of the test.

Third Exemplary Embodiment

In a third exemplary embodiment of the invention, an identification function of identifying chip addresses of the flash memories is provided to the multi-chip package according to the first and second exemplary embodiments in which the plurality of flash memories are stacked.

Figure 15:
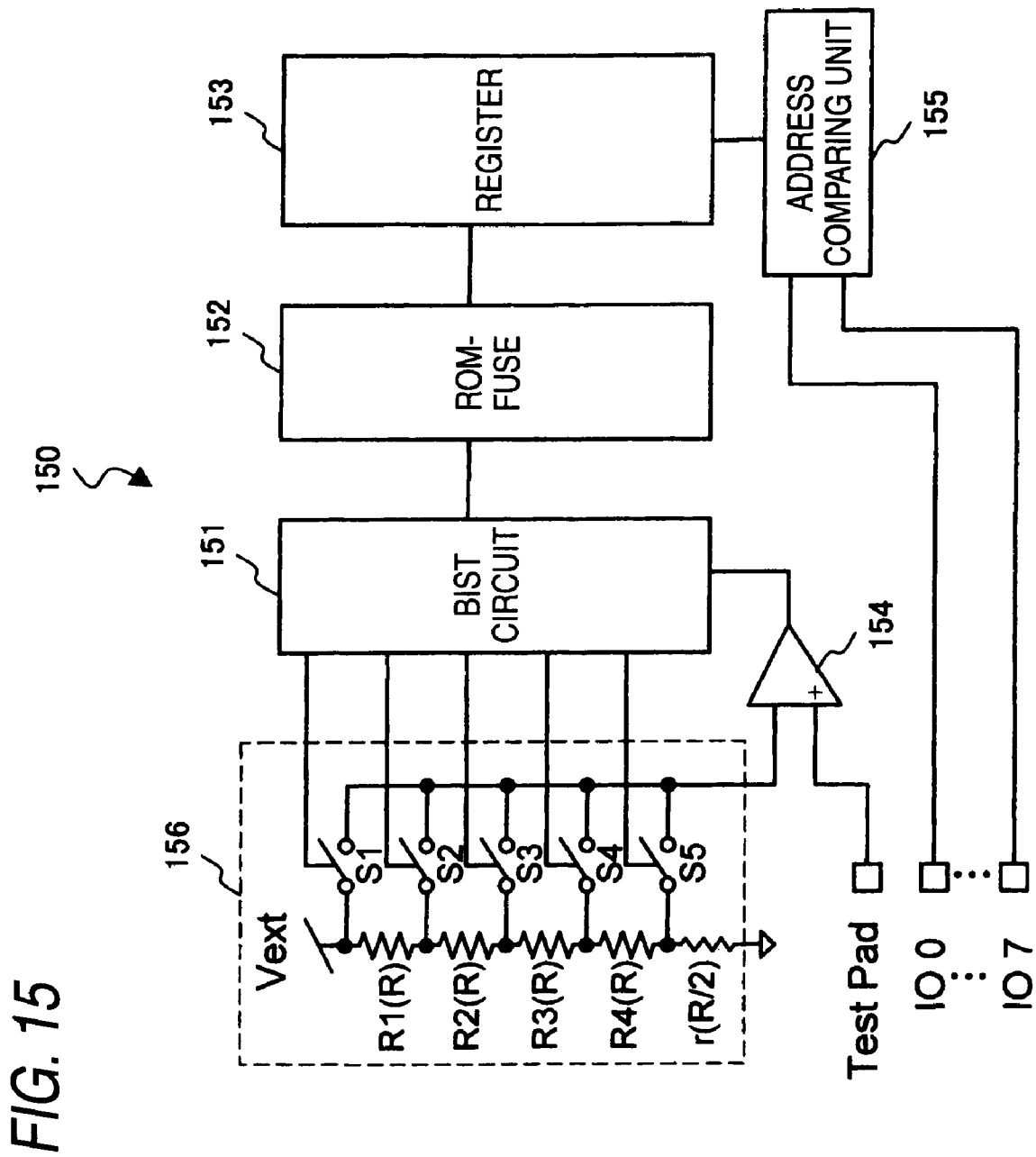
FIG. 15 is a block diagram illustrating a partial configuration of a flash memory system according to a third exemplary embodiment of the invention.

FIG. 15 is a block diagram illustrating a partial configuration of a flash memory system 150 according to the third exemplary embodiment of the invention. The flash memory system 150 comprises a BIST circuit 151, a ROM-FUSE (i.e., a memory unit) 152, a register 153, a comparator 154, an address comparing unit 155, and a memory position detecting circuit 156. The flash memory system 150 according to the third exemplary embodiment is applied to the flash memories of a multi-chip package. For example, the flash memory system 150 may be applied to the multi-chip package in which four flash memories are stacked as shown in the first and second exemplary embodiments.

The BIST circuit 151 controls the ON/OFF operation of the switches S1 to S5 for selecting a node in the memory position detecting circuit 156. The BIST circuit 150 detects the positions of the stacked flash memories (i.e., the order of the stacked chips) by comparing a divided voltage signal of a voltage Vext input from the selected node with a signal at the test pad, and stores the detection result as the memory chip address in the ROM-FUSE 152.

The ROM-FUSE 152 is a memory correlating and storing the memory chip addresses of the flash memories with control information such as writing voltage values, reading voltage values, and erasing voltage values of the flash memories.

The register 153 reads the control information from the ROM-FUSE 152 and temporarily stores the read control information in accordance with the memory chip address input from the address comparing unit 150, at the time of testing the operations of the flash memories.

The comparator 154 receives the divided voltage signal supplied from the memory position detecting circuit 156 through the inverted input terminal (−), receives a signal provided at the test pad through the non-inverted input terminal (+), compares the divided voltage signal with the signal at the test pad, and outputs a comparison result to the BIST circuit 151.

The address comparing unit 155 compares the memory chip addresses input from the IO pads IO0 to IO7 with the memory chip addresses read from the ROM-FUSE 152 through the register 153 to specify the target flash memory and outputs the specified memory chip address to the register 153.

The memory position detecting circuit 156 comprises resistive elements R1 to R4 having a resistance value R and a resistive element r having a resistance value R/2 all of which are coupled together in series, and switches S1 to S5 coupled to nodes among the resistive elements R1 to R4 and the resistive element r, respectively. The resistive elements R1 to R4 and the resistive element r are formed by coupling together poly resistors in series in a memory chip. The node coupled to the resistive element R1 and the switch S1 is coupled to a memory position detecting voltage Vext. The nodes among the resistive element R1 to R4 and the resistive element r are selected by controlling the ON/OFF operation of the switches S1 to S5 by the use of the BIST circuit 151. The voltage division ratio of the memory position detecting voltage Vext is determined based on the selected node. The divided voltage signal (i.e., the comparison signal) of the memory position detecting voltage Vext is input to the inverted input terminal (−) of the comparator 154.

Figure 16:
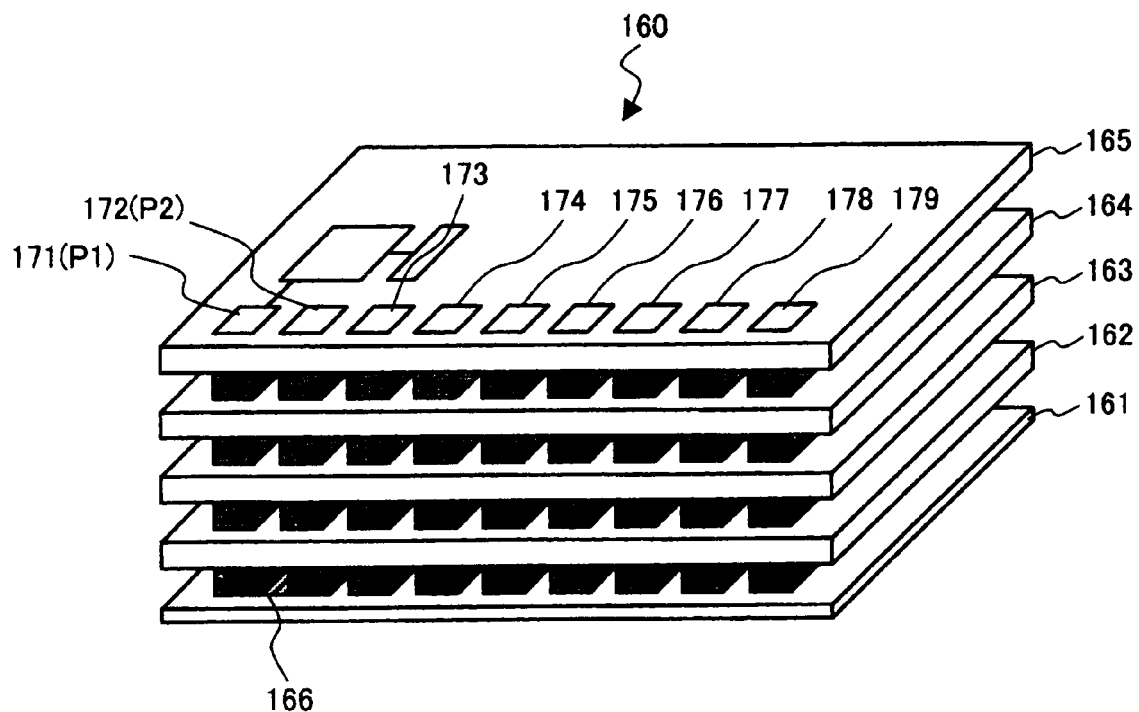
FIG. 16 is a diagram illustrating a configuration of a multi-chip package according to the third exemplary embodiment.

The configuration of the multi-chip package in which four flash memories are stacked and the memory position detecting pads are assigned is shown in FIG. 16. In the multi-chip package 160 shown in FIG. 16, a plurality of flash memory chips 162 to 165 are stacked on a substrate 161 using vertical via holes. A plurality of pads 171 to 179 are formed on each of the flash memory chips 162 to 165. In the third exemplary embodiment, the pad 171 at the left end in the figure and the pad 172 adjacent thereto of the pads 171 to 179 are used as the memory position detecting pads. The other pads 173 to 179 are used for an IO pad, a control pad Control, a power supply pad Vdd, and a ground pad Vss among the flash memory chips 162 to 165. Each of the pads 171 to 179 are coupled to each other among the flash memory chips 162 and 165. In other words the pad 171 of the flash memory chip 162 is coupled to pad 171 of the flash memory chip 163, and so on.

Figure 17:
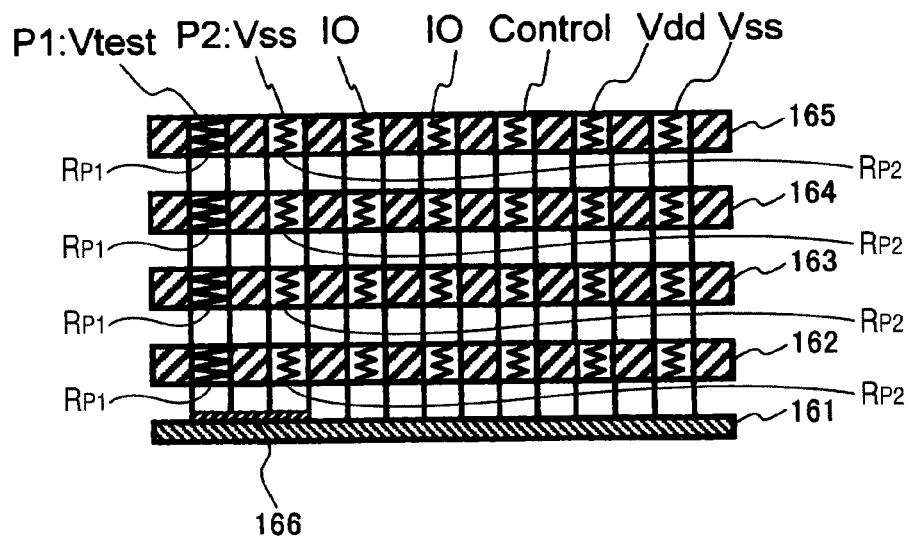
FIG. 17 is a diagram schematically illustrating a section of the multi chip package shown in FIG. 16 according to the third exemplary embodiment.
Figure 18:
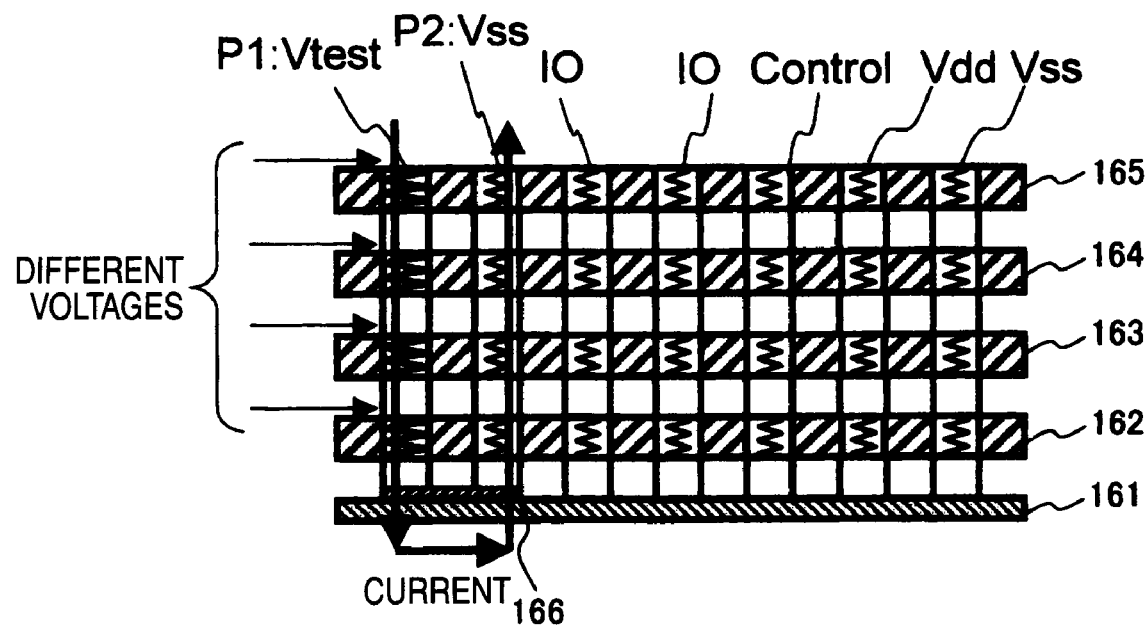
FIG. 18 is a diagram illustrating a voltage applied to memory position detecting pads of the multi-chip package according to the third exemplary embodiment.

In the third exemplary embodiment, the pad 171 is used as a first memory position detecting pad P1 and the pad 172 is used as a second memory position detecting pad P2. Each of the pads P1 and P2 are coupled to each other among the flash memory chips 162 to 165. The first memory position detecting pads P1 and the second memory position detecting pads P2 are short-circuited by conductive patterns 166 on the substrate 161 as shown in FIGS. 17 and 18. The first memory position detecting pads P1 and the second memory position detecting pads P2 of the flash memory chips 162 to 165 are electrically coupled to each other through eight via holes. As shown in FIG. 18, if a test voltage Vtest is applied to the first memory position detecting pad P1 of the uppermost flash memory 165 from an external tester, or the like, and the second memory position detecting pad P2 of the flash memory 165 is coupled to the ground pad Vss, current flows from the first memory position detecting pads P1 of the stacked flash memories 162 to 165 to the second memory position detecting pads P2 through the eight via holes.

Figure 19:
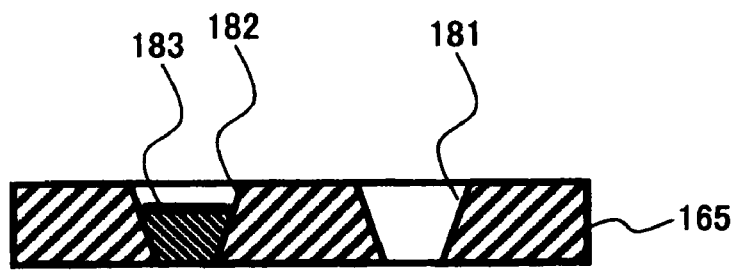
FIG. 19 is a diagram illustrating a configuration of a via hole set to a high resistance value according to the third exemplary embodiment.

In the third exemplary embodiment, as shown in FIG. 17, the via holes coupling the first memory position detecting pads P1 of the flash memories 162 to 165 have a resistance value Rp1 higher than a resistance value Rp2 of the other via holes. That is, Rp1>Rp2. Specifically, for example, in the via hole formed in the flash memory 165, only the material 183 of the via hole 182 is changed as shown in FIG. 19. An example of the material 183 includes a high-resistance material such as a carbon resistor. Alternatively, the diameter of the via hole 182 may be set to be smaller than that of the other via holes 181, thereby obtaining the higher resistance. Metal oxide such as alumina may be interposed in the via hole 182, thereby obtaining the high resistance. The via holes of the first memory position detecting pads P1 of the other flash memories 162 to 164 are formed in the same way as described above.

Figure 20:
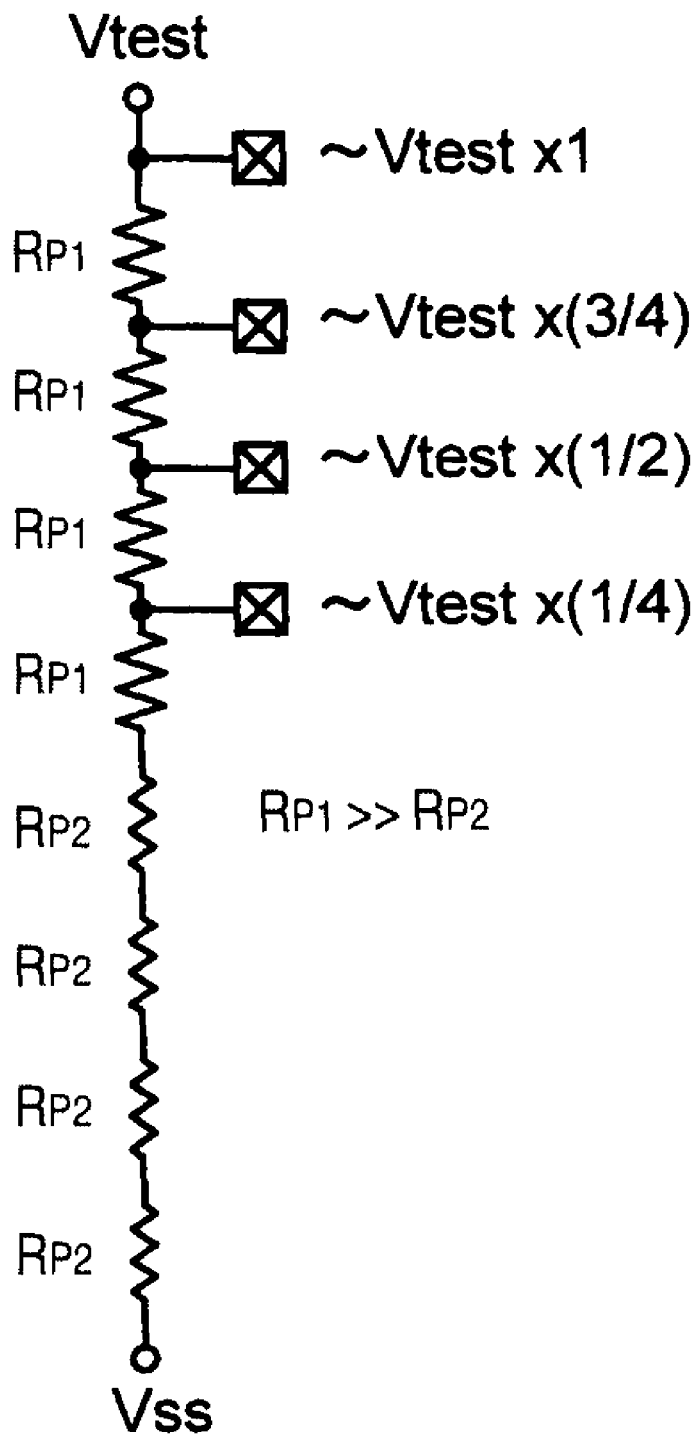
FIG. 20 is a diagram illustrating a circuit configuration of resistive elements using via resistors according to the third exemplary embodiment.

In this way, if only the via holes associated with the first memory position detecting pads P1 are designed to have the high resistance Rp1, as shown in FIG. 20, the resistive elements Rp1 can be coupled in series using the via resistance. As shown in FIG. 20, if the test voltage Vtest is applied to the first memory position detecting pad P1 of the uppermost flash memory 165, different voltages (Vtest*1), Vtest*(¾), Vtest* (½), and Vtest*(¼)) are input to the first memory position detecting pads P1 of the stacked flash memories 162 to 165. The resistance value Rp1 shown in FIG. 20 indicates the resistance value of the resistive element corresponding to the first memory position detecting pad P1 and the resistance value Rp2 indicates the resistance value of the resistive element corresponding to the second memory position detecting pad P2. In this case, the relation of the resistance Rp1 and the resistance Rp2 satisfies the relation of Rp1>>Rp2 as shown in FIG. 20.

Through the relation of divided voltages input to the first memory detecting pads P1 of the flash memories 162 to 165 at the time of application of the test voltage Vtest is shown in FIG. 20, a voltage corresponding to the divided voltages input to the first memory position detecting pads P1 of the flash memories 162 to 165 is input to the test pads from the external tester. By allowing the comparator 154 to compare the voltage values of the divided voltages with the known voltage values (known voltage values generated in the flash memories 162 to 165) generated from the selected node in the memory position detecting circuit 156, it is possible to recognize in what layers the flash memories 162 to 165 are stacked. By writing the voltage values recognized by the flash memories 162 to 165 to the ROM-FUSE 152, the flash memories 162 to 165 can have specific memory chip addresses.

Figure 21:
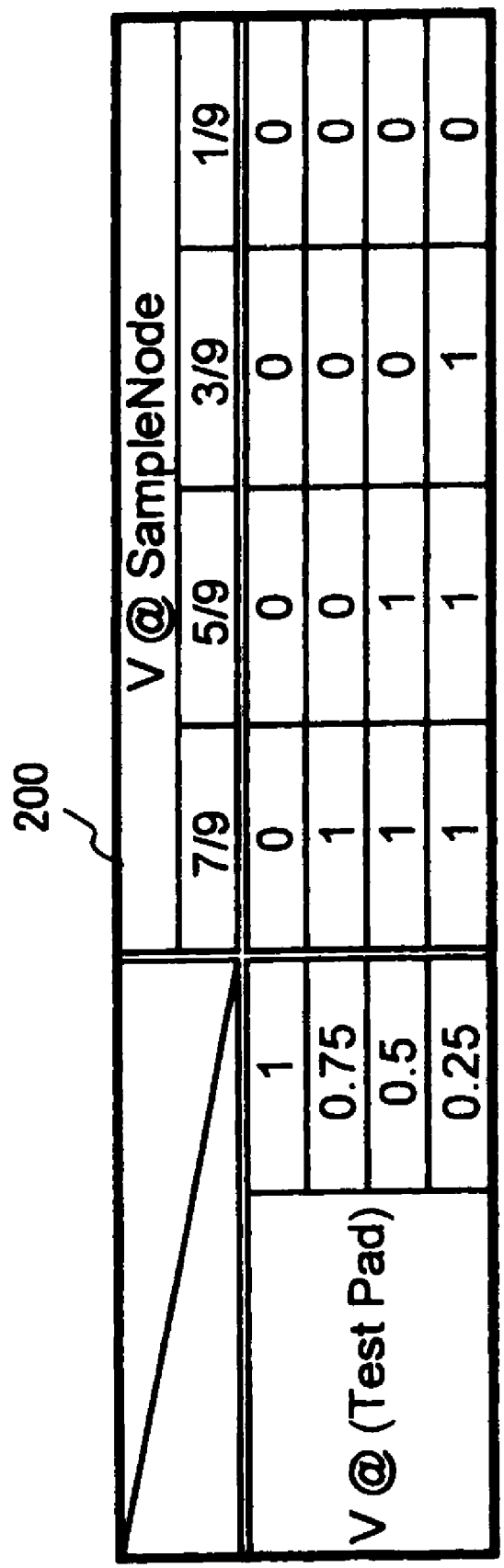
FIG. 21 is a diagram illustrating a test voltage node selection table according to the third exemplary embodiment.

The relation between the divided voltages of the test voltage Vtest input from the tester and the ON/OFF operations of the switches S1 to S5 in the memory position detecting circuit 156 is shown as a test voltage node selection table 200 in FIG. 21. In the test voltage node selection table 200, "V@(Test Pad)" indicates the divided voltages of the test voltage Vtest input from the tester and "V@SampleNode" indicates the ON/OFF states of the switches S1 to S4 for selecting a node in the memory position detecting circuit 156. In this case, "0" indicates that the switches S1 to S5 are turned off and "1" indicates that the switches S1 to S5 are turned on. "⅞, ⅝, ⅜, and ⅛" in the figure indicates a resultant resistance value based on the resistance values R and R/2 of the resistive elements R1 to R4 and the resistive element r, respectively, in the memory position detecting circuit 156 coupled to the nodes selected by means of the ON/OFF operations of the switches S1 to S5. The test voltage node selection table 200 is used for an ID writing operation of the tester to be described later.

The following correlation is obtained from the test voltage node selection table 200. If the tester inputs the test voltage Vtest "1" to the test pad for the flash memory 165 to perform the ID writing operation, the BIST circuit 151 turns on only the switch S1 and turns off the other switches S2 to S5. If the tester inputs the test voltage Vtest "0.75" to the test pad for the flash memory 165 to perform the ID writing operation, the BIST circuit 151 turns on only the switch S2 and turns off the switches S1 and S3 to S5. If the tester inputs the test voltage Vtest "0.5" to the test pad for the flash memory 165 to perform the ID writing operation, the BIST circuit 151 turns on the switches S2 and S3 and turns off the switches S1, S4, and S5. If the tester inputs the test voltage Vtest "0.25" to the test pad for the flash memory 165 to perform the ID writing operation, the BIST circuit 151 turns on the switches S2 to S4 and turns off the switches S1 and S5. The correlation is true of the flash memories 162 to 165.

Although it is shown in FIG. 19 that the material 183 or the diameter of the via hole 182 is changed to set the resistive elements corresponding to the first memory position detecting pads P1 of the flash memories 162 to 165 to a high resistance value, an alternative specific configuration for setting the high resistance value is described now with reference to FIG. 22.

Figure 22A:
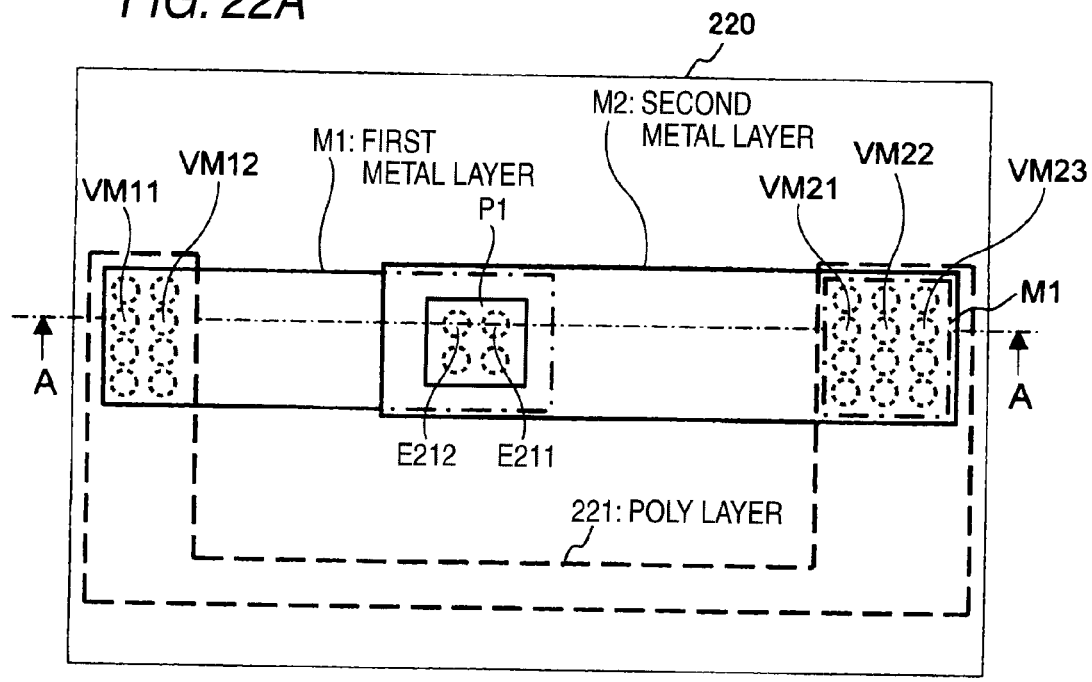
FIG. 22A is a plan view illustrating a layout of a via region in the flash memory according to the third exemplary embodiment.
Figure 22B:
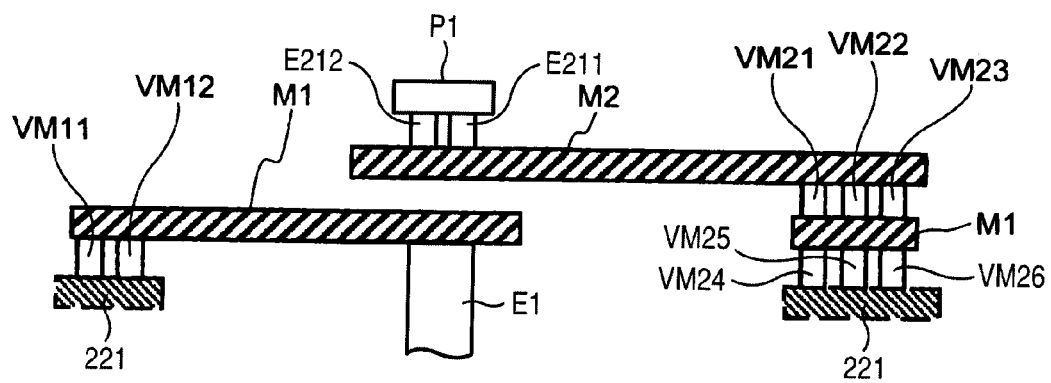
FIG. 22B is a schematic perspective sectional view taken along line A-A of FIG. 22A.

FIG. 22(a) is a plan view illustrating an example of a layout of a via region with respect to the first memory position detecting pad P1 in the flash memory according to the third exemplary embodiment. FIG. 22(b) is a diagram schematically illustrating a perspective section taken along line A-A of FIG. 22(a). In the via region 220 shown in FIG. 22(a), a poly layer 221, a first metal layer M1, and a second metal layer M2 are sequentially formed from the lower layer and the layers are coupled to each other through via holes VM11, VM12, VM21 to VM23, and VM24 to VM26. In this case, the pad P1 is connected to the second metal layer M2 via first upper electrodes E211 and E212, and first lower electrode E1 is connected to the first metal layer. The first metal layer M1 and the second metal layer M2 are formed of copper (Cu) or aluminum (Al) and the first lower electrode E1 is formed to be electrically connected to the first metal layer M1 by the use of a selective etching process.

Figure 22C:
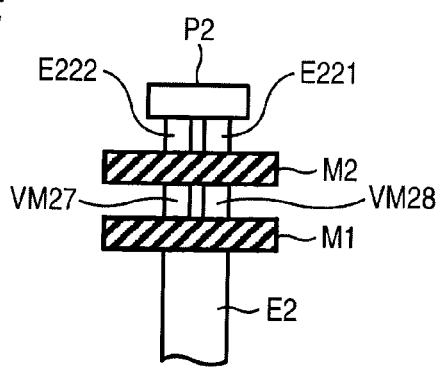
FIG. 22C is a schematic perspective sectional view illustrating a via region with respect to the second memory position detecting pad.

FIG. 22(c) is a diagram schematically illustrating a perspective section of a via region with respect to the second memory position detecting pad P2 in the flash memory. A first metal layer M1, and a second metal layer M2 are sequentially formed from the lower layer and the layers are coupled to each other through via holes VM27 and VM28. The pad P2 is connected to the second metal layer M2 via second upper electrodes E221 and E222, and first lower electrode E2 is connected to the first metal layer.

As compared with FIG. 22(b), a first channel from the pad P1 to the first lower electrode E1 is longer than a second channel from the pad P2 to the second lower electrode E2. Additionally, the first channel includes the poly layer 221. Therefore, the resistance value of the first channel becomes larger than the resistance value of the second channel.

The first lower electrode E1 and second lower electrode E2 is plated with copper (Cu) and the plated portion is soldered with tin (Sn). In this way, by forming the via region in the flash memory, as shown in FIG. 20, the relation between the resistance value Rp1 of the via holes serving as the first memory position detecting pads P1 of the stacked flash memories 162 to 165 and the resistance value Rp2 of the second memory position detecting pads P2 can be set to satisfy Rp1>> Rp2. As shown in FIG. 17, by applying the test voltage Vtest to the first memory position detecting pad P1 of the uppermost flash memory 165 and coupling the second memory position detecting pad P2 of the uppermost flash memory 165 to the ground pad Vss, current flows through the via holes of the flash memories 162 to 165. As a result, different voltages (Vtest*1, Vtest*(¾), Vtest*(½), and Vtest*(¼)) are input to the first memory position detecting pads P1 of the stacked flash memories 162 to 165.

Next, a test sequence of the ID writing/reading operation test performed on the flash memory system 150 shown in FIG. 15 by the tester will be described with reference to the flowchart shown in FIG. 23. In the test sequence, it is assumed that the ID writing/reading operation test of the flash memory 165 is performed.

Figure 23:
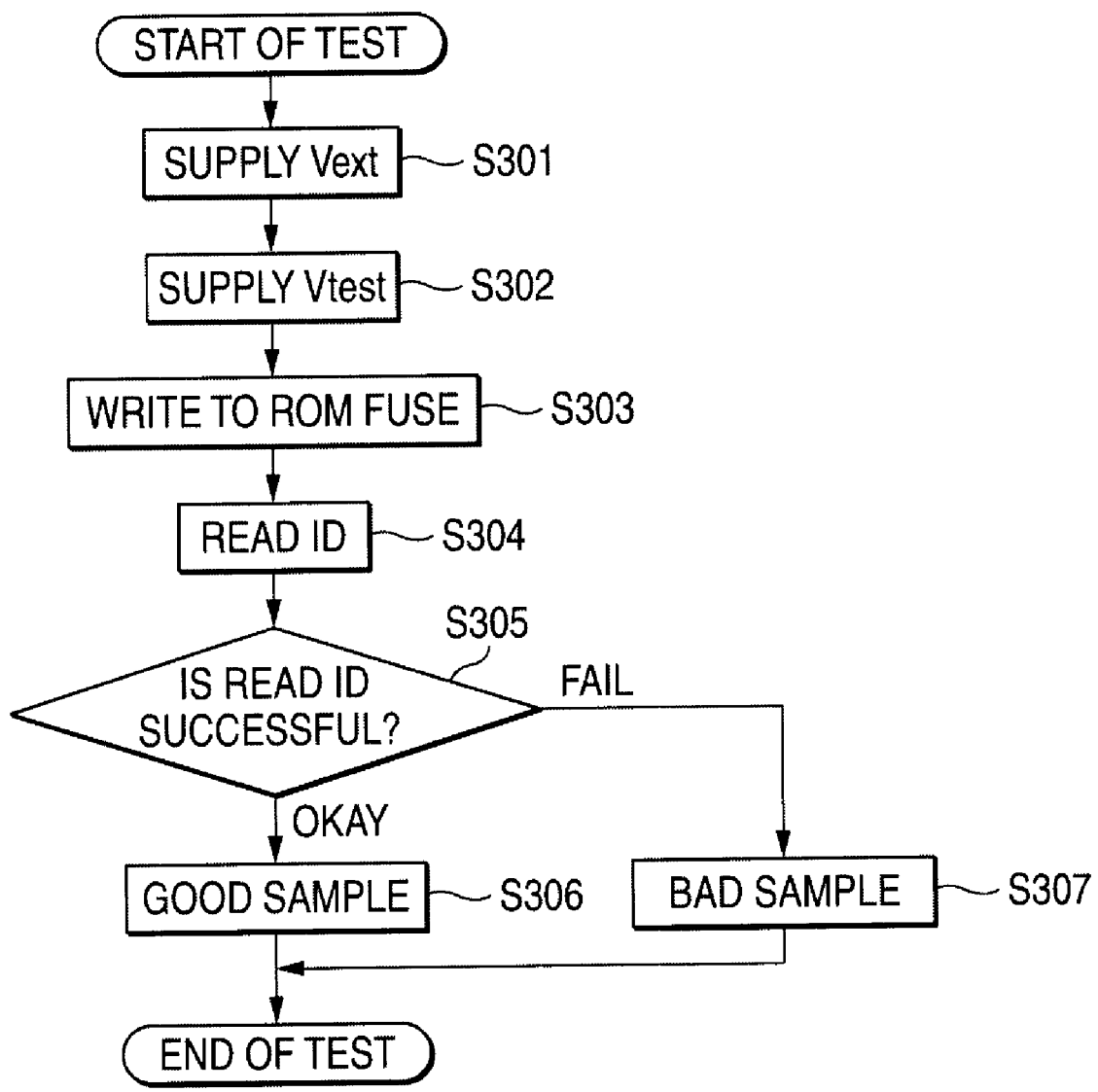
FIG. 23 is a flowchart illustrating a test sequence of an ID writing/reading operation test according to the third exemplary embodiment.

In FIG. 23, the tester supplies the memory position detecting voltage Vext to the memory position detecting circuit 156 shown in FIG. 15 to execute the ID writing operation of the flash memory 165 (operation S301). Then, the tester inputs the test voltage Vtest corresponding to the ID of the flash memory 165 to the test pad shown in FIG. 15 (operation S302). That is, the tester inputs the test voltage Vtest shown in the test voltage node selection table 220 to the test pad. The BIST circuit 151 of the flash memory system 150 controls the ON/OFF operations of the switches S1 to S5 corresponding to the test voltage Vtest shown in the test voltage node selection table 220 to input the divided voltage signal of the voltage Vext to the comparator 154.

Then, the comparator 154 compares the test voltage Vtest input from the test pad with the divided voltage signal input from the memory position detecting circuit 156 and inputs the comparison result to the BIST circuit 151. The BIST circuit 151 detects the position of the stacked flash memory 165 (i.e., the order in the stacked chips) on the basis of the input comparison result and stores the detection result as the chip addresses in the ROM-FUSE 152 (operation S303).

Then, the tester reads the ID (operation S304). The tester inputs the ID reading command and the memory chip addresses to the IO pads 100 to 107 to test the ID reading operation of the flash memory 165. When the memory chip addresses are input from the JO pads 100 to 107, the address comparing unit 155 of the flash memory system 150 reads the memory chip address from the ROM-FUSE 152 through the register 153 and compares the read memory chip address with the input memory chip address, and outputs chip information to the tester through the JO pads 100 to 107 if both addresses are equal to each other.

The tester then determines whether the ID reading operation for each chip address was successful (operation S305). If the ID reading operation for each chip address was successful (okay in operation S305), the tester can confirm that the chip ID writing operation of the flash memory 165 is ended without any problem (operation 5306). If the tester does not determine that the ID reading operation was successful (fail in operation S305), the tester can confirm that the ID writing operation of the flash memory 165 failed (operation S307). In this case, the tester can perform a countermeasure such as performing the ID writing operation of the flash memory again at once.

In the multi-chip package including the flash memory system 150, pins are disposed outside the package to provide the first memory position detecting pad P1 and the second memory position detecting pad P2 from the tester. Since the pins are used for a pre-shipping test and are not used after the pre-shipping test, the pins are treated as NC (No Connection) in the specification.

As described above, if the multi-chip package in which a plurality of memory chips having a memory chip address written thereto are stacked is shipped as a product, a method of specifying the memory chip addresses is described now.

First, the use of the ID reading operation can be considered as a method of specifying the memory chip addresses. In this case, a CE (Chip Enable) command used in the ID reading operation is used. Specifically, by constructing the CE command with 2 bits and setting any one of "00", "01", "10", and "11", it is possible to specify one memory chip address of the four memory chips stacked in the multi-chip package.

The use of an address command for specifying an address in a memory chip can be considered as another method of specifying a memory chip address. In this case, although the number of bits of the address command varies depending on the capacity of the memory cell array, two upper bits are used. Specifically, by setting the two upper bits to any one of "00", "01", "10", and "11", it is possible to specify one memory chip address of the four memory chips stacked in the multi-chip package.

Although it has been shown in the flowchart shown in FIG. 23 that the chip ID writing operation of the flash memory 165 fails and the test is ended if the ID reading operation for any chip address cannot be confirmed (fail in operation S305), alternatively it may be determined whether the chip ID writing operation of the flash memory 165 fails by repeating the ID reading operation a plurality of times. This operation is described with reference to the flowchart shown in FIG. 24.

Figure 24:
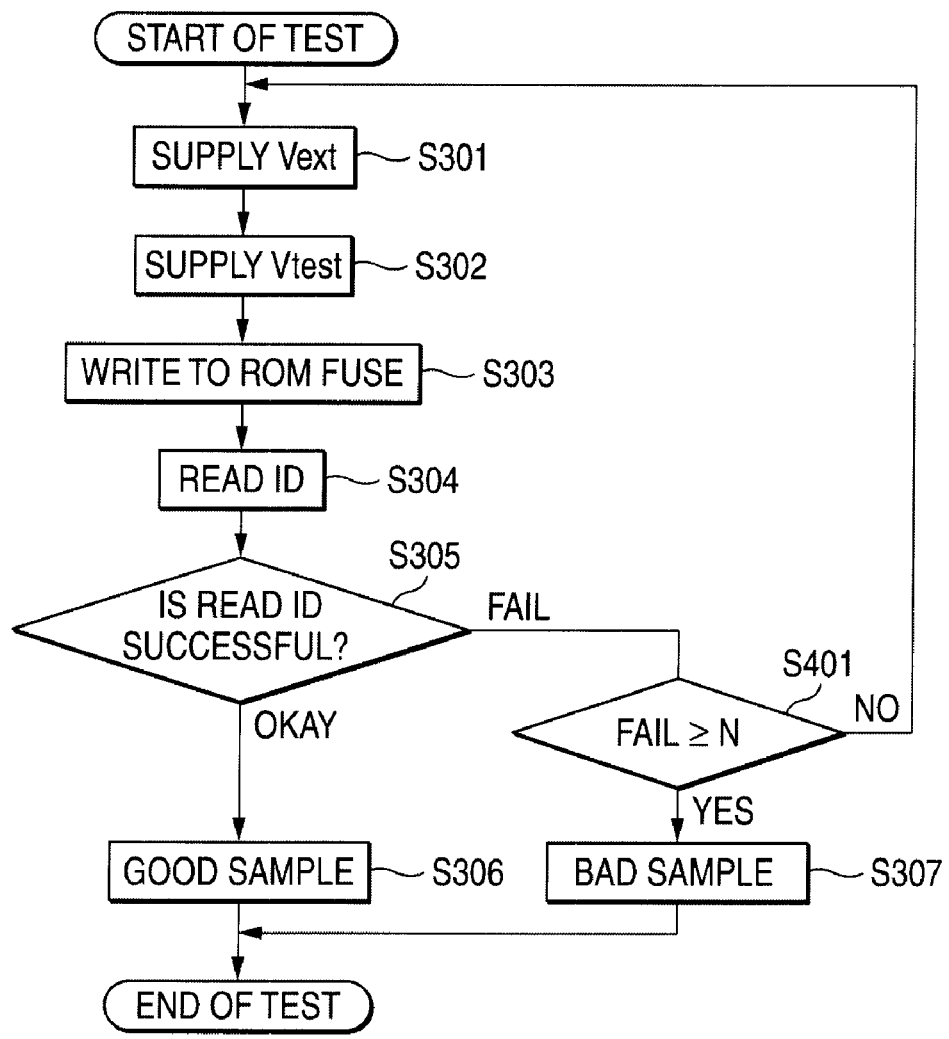
FIG. 24 is a flowchart illustrating another test sequence of the ID writing/reading operation test according to the third exemplary embodiment.

As shown in FIG. 24, if the processes of operations S301 to 5305 are performed similarly to FIG. 23 and the ID reading operation cannot be confirmed (fail in operation S305), it is determined whether the number of fails reaches N (operation S401). If it is determined that the number of fails does not reach N (for example, 5) (No in operation S401), the processes of operations S301 to S305 are repeated from operation S301. If it is determined that the number of fails reaches N (Yes in operation S401), it can be confirmed that the chip ID writing operation of the flash memory 165 fails (operation S307). In this case, the tester can automatically repeatedly perform the ID writing operation on the corresponding flash memory, thereby reliably determining whether the flash memory is a defective chip.

As described above, in the flash memory system 150 according to the third exemplary embodiment, the multi-chip package having the flash memories stacked therein has an identification function of identifying the chip addresses of the flash memories. The plurality of flash memories are stacked using the plurality of via holes, some of the via holes being used as the memory position detecting pads. The configuration (the structure, the material, and the diameter of the via holes) for setting some via holes used as the memory position detecting pads to high resistance has been studied so as to apply a voltage for testing the ID writing/reading operation to the memory position detecting pads. Accordingly, in the multi-chip package having the flash memories stacked therein, it is possible to generate the voltage for setting the memory chip addresses (ID) for identifying the positions of the flash memories stacked in the vertical direction in the memory chips, thereby facilitating the operation test of writing and reading the memory chip addresses (ID). By applying the configuration in which one pump chip is shared by the plurality of flash memories according to the first exemplary embodiment to the flash memory system 150 according to the third exemplary embodiment, it is possible to reduce the mounting area of the flash memories, thereby enhancing the number of flash memory chips to be stacked.

Although it has been described in the third exemplary embodiment that the first memory position detecting pads P1 and the second memory position detecting pads P2 are formed in the via region in which the plurality of via holes are formed, the pads may be formed in a different empty region in the memory chips.

Fourth Exemplary Embodiment

In a fourth exemplary embodiment of the invention, configurations of the first memory position detecting pads and the second memory position detecting pads in the multi-chip package having the plural flash memories according to the third exemplary embodiment are described. Since a configuration of a flash memory system according to the fourth exemplary embodiment is similar to the configuration of the flash memory system 150 shown in FIG. 15 according to the third exemplary embodiment, the description of the illustration and configuration is omitted.

Figure 25:
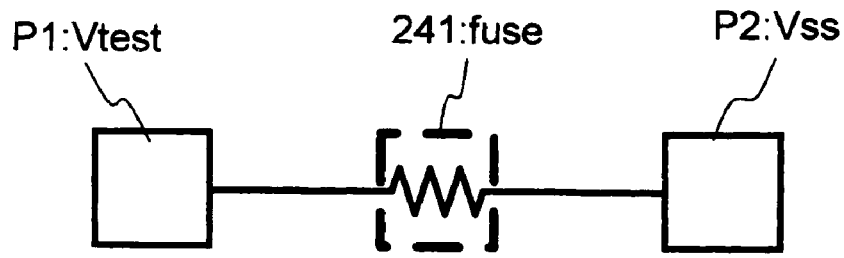
FIG. 25 is a diagram illustrating a configuration of a first memory position detecting pad and a second memory position detecting pad according to a fourth exemplary embodiment of the invention.

FIG. 25 is a diagram illustrating configurations of the first memory position detecting pads and the second memory position detecting pads applied to the multi-chip package. This configuration is similar to the configuration of FIG. 16, except that a fuse 241 is provided. As shown in FIG. 25, the first memory position detecting pads P1 and the second memory position detecting pads P2 formed on the memory chips are coupled to each other through a fuse 241 formed of metal or a well. At the time of opening the via holes (VIA), the fuse 241 is electrically cut in the flash memories other than the lowermost flash memory.

As described above, since the first memory position detecting pads P1 and the second memory position detecting pads P2 are coupled together through the fuse 241 formed of a metal or a well, the conductive patterns 166 coupling together the first memory position detecting pad P1 and the second memory position detecting pad P2 of the lowermost layer in FIG. 16 is not used. Thereby, the configuration of the flash memories in the package may be simplified.

As described above with reference to exemplary embodiments of the invention, there is provided a semiconductor device enabling a pre-shipping test of memory chips by removing pump circuits supplying an operation voltage from the memory chips and employing a particular chip as a pump chip.

As described above with reference to exemplary embodiments of the invention, there is provided a semiconductor device, the manufacturing costs of which are reduced, where the semiconductor device is constructed as a multi-chip package in which a plurality of nonvolatile semiconductor memories share a single boosting circuit.

It is noted that the above exemplary embodiments were described with respect to a multi-chip package comprising four memories. However, the present inventive concept is applicable to a multi-chip package comprising any number of memories packaged into a multi-chip package.

While the present invention has been shown and described with reference to certain exemplary embodiments thereof, it will be understood by those skilled in the art that various changes in form and details may be made therein without departing from the spirit and scope of the invention as defined by the appended claims.

What is claimed is:

1. A multi-chip device comprising:
a plurality of nonvolatile semiconductor memories which are stacked on top of each other, and
a boosting circuit which generates a boosted voltage for operating the plurality of nonvolatile semiconductor memories, wherein each of the nonvolatile semiconductor memories comprises:
a first device position detecting pad thereon; and
a second device position detecting pad thereon,
wherein the first device position detecting pads of the nonvolatile semiconductor memories are coupled together, the second device position detecting pads of the nonvolatile semiconductor memories are coupled together, and the first device position detecting pad and the second device position detecting pad of a lowermost nonvolatile semiconductor memory are coupled together.

2. The multi-chip device according to claim 1, wherein the boosting circuit is positioned on the uppermost nonvolatile semiconductor memory.

3. The multi-chip device according to claim 1, further comprising:
a boosting circuit controller which controls the operation of the boosting circuit to generate the boosted voltage on the basis of an operation sequence of the plurality of nonvolatile semiconductor memories.

4. The multi-chip device according to claim 3, further comprising:
a reference voltage generating circuit which generates a reference voltage; and
a comparison circuit which compares the boosted voltage with the reference voltage, and outputs a comparison result,
wherein the boosting circuit controller outputs a control signal for controlling a voltage level of the boosted voltage to the boosting circuit on the basis of the comparison result.

5. The multi-chip device according to claim 3, the boosting circuit comprises a plurality of boosting circuits,
wherein a number of the plurality of boosting circuits is equal to a number of the plurality of nonvolatile semiconductor memories, and
the boosting circuit controller controls the operations of the plurality of boosting circuits.

6. The multi-chip device according to claim 3, wherein the boosting circuit controller individually controls the operations of a plurality of boosting circuits to generate the boosted voltage on the basis of the operation sequence.

7. The multi-chip device according to claim 3, wherein the boosting circuit controller simultaneously controls the operations of a plurality of boosting circuits to generate the boosted voltage on the basis of the operation sequence.

8. The multi-chip device according to claim 3, wherein each of the plurality of nonvolatile semiconductor memories comprises a pad for outputting an operation result, and
wherein the boosting circuit comprises a pad for the operation result output from the nonvolatile semiconductor memories, and the boosting circuit changes a voltage level of the boosted voltage on the basis of the operation result.

9. A semiconductor memory tester to test nonvolatile semiconductor memories in a multi-chip device including a plurality of nonvolatile semiconductor memories which are stacked on top of each other and are configured to receive a boosted voltage for operating the plurality of nonvolatile semiconductor memories, the tester comprising:
a tester board comprising;
a boosting circuit which generates a boosted voltage for operating the plurality of nonvolatile semiconductor memories; and
a boosting circuit controller which controls the boosting circuit to generate the boosted voltage on the basis of an operation sequence of the plurality of nonvolatile semiconductor memories.

10. A test board for use in a semiconductor memory tester to test the nonvolatile semiconductor memories for use in a multi-chip device comprising a plurality of nonvolatile semiconductor memories which are stacked on top of each other, and are configured to receive a boosted voltage for operating the plurality of nonvolatile semiconductor memories, the test board comprising:
a boosting circuit which generates a boosted voltage for operating the plurality of nonvolatile semiconductor memories; and
a boosting circuit controller which controls the operation of the boosting circuit to generate the boosted voltage on the basis of an operation sequence of the plurality of nonvolatile semiconductor memories.

* * * * *